United States Patent
Fujioka

(10) Patent No.: US 6,813,191 B2
(45) Date of Patent: Nov. 2, 2004

(54) MICROCOMPUTER WITH NONVOLATILE MEMORY PROTECTED AGAINST FALSE ERASING OR WRITING

(75) Inventor: Shuzo Fujioka, Hyogo (JP)

(73) Assignees: Renesas Technology Corp., Tokyo (JP); Mitsubishi Electric System LSI Design Corporation, Itami (JP)

(*) Notice: Subject to any disclaimer, the term of this patent is extended or adjusted under 35 U.S.C. 154(b) by 0 days.

(21) Appl. No.: 10/234,386

(22) Filed: Sep. 5, 2002

(65) Prior Publication Data

US 2003/0169624 A1 Sep. 11, 2003

(30) Foreign Application Priority Data

Mar. 7, 2002 (JP) ........................................ 2002-062472

(51) Int. Cl.[7] ............................................. G11C 11/34
(52) U.S. Cl. .............................. 365/185.29; 365/185.18
(58) Field of Search ..................... 365/185.29, 185.18; 395/800.37

(56) References Cited

U.S. PATENT DOCUMENTS

| | | | |
|---|---|---|---|
| 5,086,413 A | * 2/1992 | Tsuboi et al. | .......... 365/230.01 |
| 5,646,891 A | * 7/1997 | Okamoto | ............... 365/185.22 |
| 5,732,017 A | * 3/1998 | Schumann et al. | .... 365/185.11 |
| 5,784,637 A | * 7/1998 | Sawase et al. | ................ 712/37 |
| 6,032,248 A | * 2/2000 | Curry et al. | .................. 712/37 |

FOREIGN PATENT DOCUMENTS

| | | |
|---|---|---|
| JP | 6-180996 A | 6/1994 |
| JP | 7-29386 A | 1/1995 |
| JP | 2001-75941 A | 3/2001 |

* cited by examiner

*Primary Examiner*—M. Tran
(74) *Attorney, Agent, or Firm*—Burns, Doane, Swecker & Mathis, L.L.P.

(57) ABSTRACT

A microcomputer includes a nonvolatile memory for storing contents that can be erased from and written to the nonvolatile memory electrically when an erasing/writing voltage is supplied to the nonvolatile memory, and a processor for executing a program stored in the nonvolatile memory. The microcomputer also includes a setting element for setting a plurality of conditions for erasing contents from or writing contents into the nonvolatile memory, and an erasing/writing voltage supply enabler for enabling the erasing/writing voltage to be supplied to the nonvolatile memory when all of the plurality of conditions are satisfied.

24 Claims, 21 Drawing Sheets

MICROCOMPUTER WITH NONVOLATILE MEMORY PROTECTED AGAINST FALSE ERASING OR WRITING

BACKGROUND OF THE INVENTION

1. Field of the Invention

The present invention relates to a microcomputer with a nonvolatile memory that needs an erasing/writing voltage for erasing and writing.

2. Background Art

Flash memories or other EEPROMs (electrically erasable programmable read only memories) are widely used as contents can be erased and written partially by electrical signals. To erase or write contents of such a nonvolatile memory, a voltage higher than that for reading is utilized usually. Alternatively, a voltage for erasing and writing, which is nearly equal to a reading voltage, is supplied to such a nonvolatile memory from a voltage supply that is different from a voltage supply for reading.

FIG. 22 is a block diagram showing an example of conventional microcomputers containing flash memories. In FIG. 22, reference numeral 1 depicts a microcomputer including a CPU (central processing unit) 2 having a program counter (PC) 3. The microcomputer 1 also includes a flash memory 4, a RAM (random-access memory) 5, and a bus 6. An erasing/writing voltage terminal 7 and a reading voltage terminal 8 are located outside the microcomputer 1.

In the microcomputer 1, the CPU 2, the flash memory 4 and the RAM 5 is interconnected via the bus 6, so that the CPU 2 exchanges information via the bus 6 with the flash memory 4 and the RAM 5.

The flash memory 4 stores various programs that the microcomputer 1 can execute, and the CPU 2 executes the programs while reading them from the flash memory 4.

The RAM 5 temporally stores data that are necessary for executing the programs. The RAM 5 is also used for executing a program for erasing or writing contents of the flash memory 4 since such a program should not be read directly from the flash memory 4 in erasing mode and writing mode. Prior to actual erasing or writing contents of the flash memory 4, the CPU 2 retrieves an erasing or writing program from the flash memory 4 and loads or stores it into the RAM 5 temporally. Then, the CPU 2 erases contents from or writes contents into the flash memory 4 while reading the erasing or writing program from the RAM 5.

The program counter 3 of the CPU 2 indicates the address of the next instruction to be executed among the running program. Consequently, the CPU 2 identifies the next address to be referred to in the storage (the flash memory 4 or the RAM 5), so that the program may be executed smoothly.

A high level voltage $V_{pp}$ is supplied from the erasing/writing voltage terminal 7 to the flash memory 4 for erasing or writing contents of the flash memory 4. A low level, voltage $V_{cc}$ is supplied from the reading voltage terminal 8 to the flash memory 4 for reading contents from the flash memory 4. While this specification describes that the voltage $V_{pp}$ is high and the voltage $V_{cc}$ is low, the voltage $V_{pp}$ may be equal to the voltage $V_{cc}$. The erasing/writing voltage is needed for erasing and writing contents of the flash memory 4. Unless the erasing/writing voltage is supplied to the flash memory 4, contents of the flash memory 4 cannot be erased or written. The reading voltage is necessary for reading contents from the flash memory 4.

In order to protect contents stored in a flash memory appropriately, it is preferable that a microcomputer is provided with a prevention against false erasing or writing by malfunction. An example of such attempts is disclosed in JP-A-6-180996. A computer disclosed in this publication includes a voltage transformer (booster circuit) separated from a main assembly of the computer. The main assembly includes a connector. When the connector is connected with the voltage transformer by a human operator, an erasing/writing voltage is supplied to a flash memory located within the main assembly of the computer, so that erasing or writing can be permitted.

The above-described conventional microcomputer leads inconvenience: the human operator should connect the connector to the main assembly whenever he or she would like to erase or rewrite contents of the flash memory.

However, if no prevention is provided against false erasing or writing, an erasing/writing voltage may be supplied to a flash memory by malfunction. In this case, when the computer enters erasing or writing mode accidentally, the program may run away. In order to avoid such malfunction, a usual CPU executes an erasing/writing program while reading it from a flash memory as described above. However, malfunction may occur because of noises or other reasons.

SUMMARY OF THE INVENTION

It is therefore an object of the present invention to provide a microcomputer capable of reducing or preventing false erasing or writing of contents of a nonvolatile memory that needs an erasing/writing voltage for erasing and writing.

In accordance with the present invention, a microcomputer includes a nonvolatile memory for storing contents that can be erased from and written to the nonvolatile memory electrically when an erasing/writing voltage is supplied to the nonvolatile memory, and a processor for executing a program stored in the nonvolatile memory. The microcomputer also includes a setting element for setting a plurality of conditions for erasing contents from or writing contents into the nonvolatile memory, and an erasing/writing voltage supply enabler for enabling the erasing/writing voltage to be supplied to the nonvolatile memory when all of the plurality of conditions are satisfied.

With such a structure, when all of the plurality of conditions are satisfied, the erasing/writing voltage supply enabler enables the erasing/writing voltage to be supplied to the nonvolatile memory. Therefore, it is possible to reduce or prevent false erasing or writing of contents of the nonvolatile memory that needs the erasing/writing voltage for erasing and writing.

BRIEF DESCRIPTION OF THE DRAWINGS

With reference to the accompanying drawings, various embodiments of the present invention will be described hereinafter. In the drawings.

DETAILED DESCRIPTION OF PREFERRED EMBODIMENTS

First Embodiment.

Figure 1:
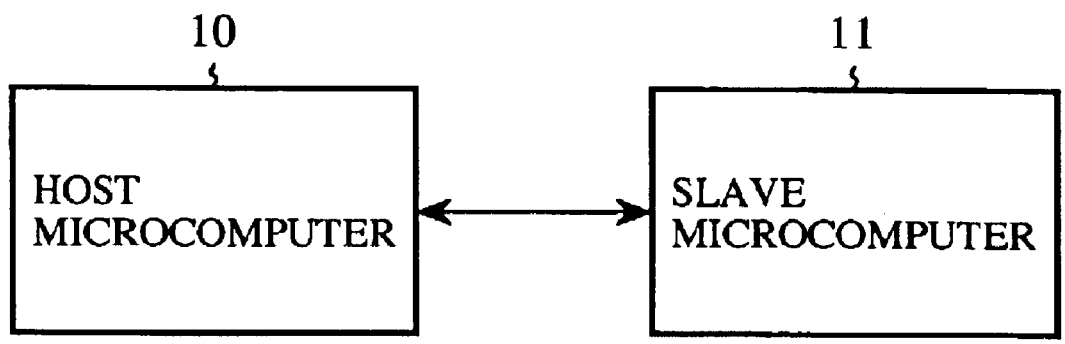
FIG. 1 is a schematic view showing a multiprocessor system that is a microcomputer according to a first embodiment of the present invention.

FIG. 1 is a schematic view showing a multiprocessor system that is a microcomputer according to a first embodiment of the present invention. The microcomputer or multiprocessor system includes a host microcomputer 10 and a slave microcomputer 11. The host microcomputer 10 and slave microcomputer 11 are linked to each other to communicate with each other.

Figure 2:
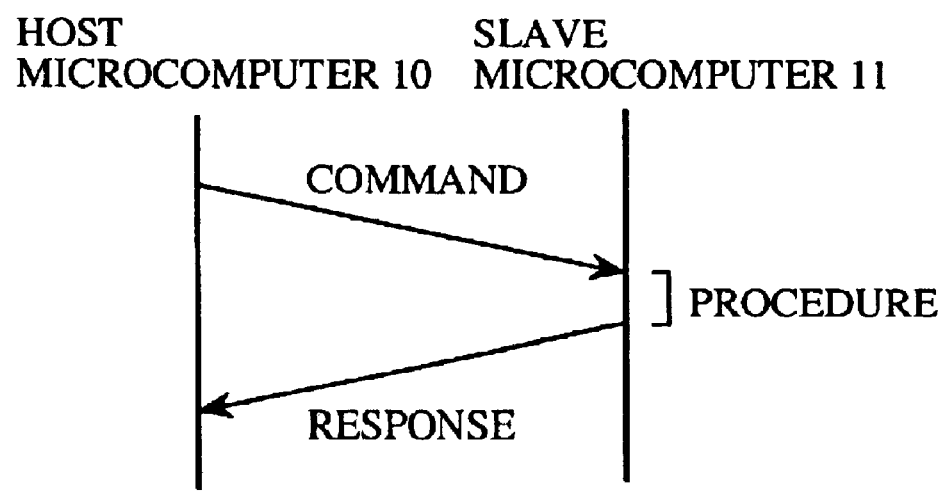
FIG. 2 is a control flow sequence diagram illustrating a schematic operation in the multiprocessor system shown in FIG. 1.

In the multiprocessor system as a single entire microcomputer, each of the host microcomputer 10 and slave microcomputer 11 includes a processor and a memory, but the slave microcomputer 11 operates as a slave of the host microcomputer 10. More specifically, as shown in FIG. 2, once the slave microcomputer 11 receives a command issued by the host microcomputer 10, the slave microcomputer 11 executes a procedure required by the command. After execution of the procedure, the slave microcomputer 11 returns a response signal indicating the completion of the procedure to the slave microcomputer 11. The response signal also indicates the result of execution of the procedure.

Figure 3:
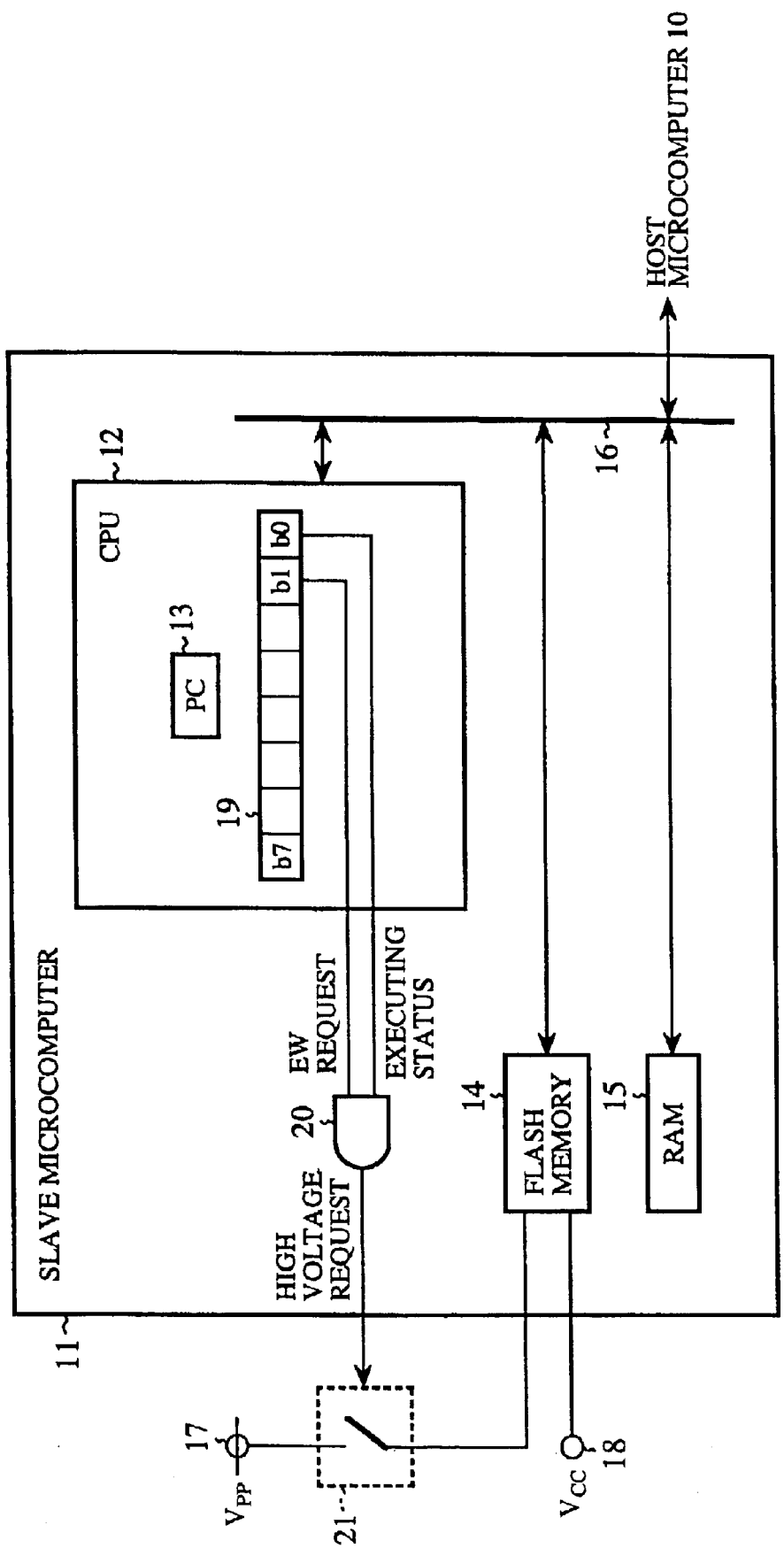
FIG. 3 is a block diagram showing details of hardware of a slave microcomputer of multiprocessor system in FIG. 1.

FIG. 3 is a block diagram showing details of hardware of the slave microcomputer 11. As shown in FIG. 3, the slave microcomputer 11 includes a CPU 12 (processor and setting element), flash memory 14 as a nonvolatile memory, a RAM 15 as a temporary memory, a bus 16, and an AND gate circuit 20 as an erasing/writing voltage supply enabler located inside thereof. It should be noted that the slave microcomputer 11 is of a single chip configuration. The CPU 12 includes a program counter (PC) 13 and a control register (setting element or selecting means) 19.

An erasing/writing voltage terminal (erasing/writing voltage supply) 17, a reading voltage terminal 18, and a switch (erasing/writing voltage supply enabler) 21 are located, as peripheral equipments, outside the single chip of the slave microcomputer 11.

The CPU 12, the flash memory 14, and the RAM 15 are interconnected via the bus (data bus) 16 in the slave microcomputer 11, so that the CPU 12 exchanges information via the bus 16 with the flash memory 14 and the RAM 15. In addition, the bus 16 is connected with a signal line that is in turn connected with the host microcomputer 10 in order that the host microcomputer 10 and the slave microcomputer 11 communicate with each other. Depending on the design of multiprocessor system, each of the host microcomputer 10 and the slave microcomputer 11 may contain a respective built-in interface for realizing communication between the microcomputers 10 and 11.

The flash memory 14 stores various programs that the CPU 12 can execute and various sorts of data.

The RAM 15 temporally stores data that are necessary for executing various programs. The RAM 15 is also used for executing a program for erasing or writing contents of the flash memory 14 since such a program should not be read from the flash memory 14 in erasing mode and writing mode. Prior to actual erasing or writing contents of the flash memory 14, the CPU 12 retrieves an erasing or writing program from the flash memory 14 and loads or stores it into the RAM 15 temporally. Then, the CPU 12 erases contents from or writes contents into the flash memory 14 while referring to the program on the RAM 15.

The program counter 13 of the CPU 12 indicates the address of the next instruction to be executed among the running program. Consequently, the CPU 12 identifies the next storage (the flash memory 14 or the RAM 15) to be referred to and the next address to be referred to in the storage, so that the program may be executed smoothly.

A high level voltage $V_{pp}$ is supplied from the erasing/writing voltage terminal 17 to the flash memory 14 for erasing or writing contents of the flash memory 14. A low level voltage $V_{cc}$ is supplied from the reading voltage terminal 18 to the flash memory 14 for reading contents from the flash memory 14. The high level voltage is needed for erasing and writing contents of the flash memory 14. Unless the high level voltage is supplied to the flash memory 14, contents of the flash memory 14 cannot be erased or written. The low level voltage is necessary for reading contents from the flash memory 14. While this specification describes that the voltage $V_{pp}$ is high and the voltage $V_{cc}$ is low, the voltage $V_{pp}$ may be equal to the voltage $V_{cc}$.

A switch 21 is interposed between the erasing/writing voltage terminal 17 and the flash memory 14 in order that the erasing/writing voltage $V_{pp}$ be supplied to the flash memory 14 only when the voltage $V_{pp}$ is necessary. The switch 21 may be comprised of, e.g. a transistor.

Only when the AND gate circuit 20 supplies a high voltage request signal (in more general meaning, erasing/writing voltage request signal) to the switch 21, the switch 21 is closed, whereby the erasing/writing voltage $V_{pp}$ is supplied to the flash memory 14. To two input terminals of the AND gate circuit 20, an erasing/writing request signal (EW request signal) and an executing status signal are supplied from the CPU 12, respectively.

The EW request signal indicates that erasing or writing is required with respect to the flash memory 14. The CPU 12 determines whether or not a subroutine program that is being executed by the CPU 12 on the basis of the command requires erasing or writing with respect to the flash memory 14. If the determination is affirmative, the CPU 12 generates the EW request signal.

More specifically, if the program requires erasing or writing with respect to the flash memory 14, the CPU 12 writes numeral one into a predetermined bit, e.g., bit 1 (abbreviated to b1 in FIG. 3) of the control register 19 inside the CPU 12 itself. This bit of the register is connected with an input terminal of the AND gate circuit 20. When the necessity of erasing or writing contents of the flash memory 14 becomes null, the CPU 12 writes numeral zero into the bit, e.g., bit 1. Consequently, insofar as erasing or writing is required with respect to the flash memory 14, bit 1 retains numeral one continually. The numeral one on bit 1 of the control register 19 is utilized as a flag, i.e., the EW request signal by the AND gate circuit 20.

The executing status signal indicates that a main program, which will be described later, is being currently executed by the CPU 12 on the basis of the command from the host microcomputer 10. The CPU 12 generates the executing status signal prior to executing the main program.

More specifically, prior to executing the main program, the CPU 12 writes numeral one into another predetermined bit, e.g., bit 0 (abbreviated to b0 in FIG. 3) of the control register 19. This bit of the register is connected with another input terminal of the AND gate circuit 20. Directly before the end of execution of the main program, the CPU 12 writes numeral zero into the predetermined bit, e.g., bit 0. Consequently, for most of the period of the execution of the main program, bit 0 retains numeral one continually. The numeral one on bit 0 of the control register 19 is utilized as a flag, i.e., the executing status signal by the AND gate circuit 20.

The AND gate circuit 20 supplies the high voltage request signal (in more general meaning, erasing/writing voltage request signal) to the switch 21 when both of the EW request signal and executing status signal are input thereto. In other words, when both of bits 1 and 0 of the control register 19 retain numeral one, the AND gate circuit 20 closes or activates the switch 21. Consequently, only when two conditions are satisfied, the erasing/writing voltage $V_{pp}$ is supplied from the erasing/writing voltage terminal 17 to the flash memory 14.

Although the control register 19 in FIG. 3 includes eight bits: b0 through b7, it may include another suitable number of bits. In addition, it is not intended to limit the present invention to the use of bits 1 and 0 for supplying the EW request signal and executing status signal, and instead, other bits may be used. It is also possible to use bit 1 for the executing status signal and bit 0 for the EW request signal on the contrary to the illustrated embodiment.

Figure 4:
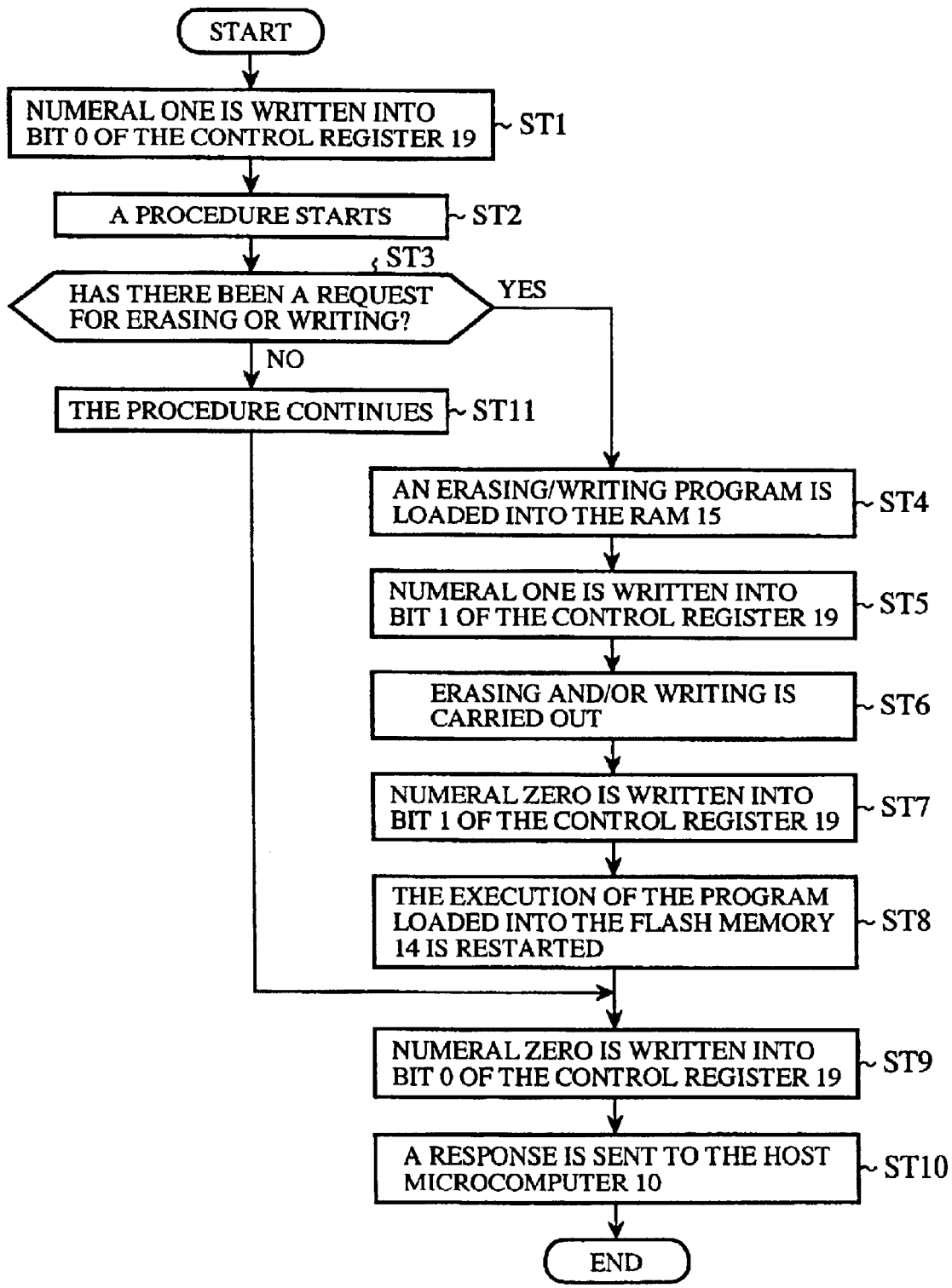
FIG. 4 is a flowchart illustrating a main program routine of a slave microcomputer in FIG. 3.

Next, operations will be described with reference to the flowchart in FIG. 4. FIG. 4 illustrates a main program routine of the slave microcomputer 11 according to this embodiment. The main program starts whenever the CPU 12 of the slave microcomputer 11 receives a command from the host microcomputer 10. Preferably, the main program illustrated in FIG. 4 is loaded from the flash memory 14 to the RAM 15, and then executed.

First, the CPU 12 writes numeral one into bit 0 of the control register 19 at step ST1. As described above, writing numeral one into bit 0 means continuously supplying the executing status signal to the AND gate circuit 20 thereafter.

Next, the CPU 12 starts a procedure of a subroutine program based on the command at step ST2. More specifically, the CPU 12 retrieves the subroutine program from the flash memory 14 in accordance with the command from the host microcomputer 10, and commences executing the subroutine program. The CPU 12 then determines, at step ST3, whether or not there has been a request for erasing or writing contents of the flash memory 14. At step ST3, the CPU 12 may decide whether or not the subroutine program includes such a request.

If there is a request for erasing or writing and the determination at step ST3 is affirmative, the main program routine proceeds to step ST4. At step ST4, the CPU 12 reads an erasing/writing subroutine program (erasing/writing program) from the flash memory 14 and loads it into the RAM 15.

The CPU 12 then writes numeral one into bit 1 of the control register 19 at step ST5. As described above, writing numeral one into bit 1 means continuously supplying the EW request signal to the AND gate circuit 20 thereafter. The AND gate circuit 20 commences supplying the high voltage request signal to the switch 21 on the basis of the EW request signal and executing status signal. The executing status signal has been supplied to the AND gate circuit 20 since numeral one has been already retained on bit 0 since step ST1. The high voltage request signal activates the switch 21, whereby the erasing/writing voltage $V_{pp}$ is supplied from the erasing/writing voltage terminal 17 to the flash memory 14 for enabling contents of the flash memory 14 to be erased or written.

Next, the CPU 12 erases contents from the flash memory 14 or writes contents into the flash memory 14 at step ST6. This step is carried out by executing the erasing/writing program, which has been loaded into the RAM 15 since step ST4.

After completion of step ST6, the CPU 12 writes numeral zero into bit 1 of the control register 19 at step ST7. Writing numeral zero into bit 1 means that the necessity of erasing or writing contents of the flash memory 14 becomes null thereafter, and hence the EW request signal is no longer necessary to be supplied to the AND gate circuit 20. Directly after writing numeral zero into bit 1, the AND gate circuit 20 stops supplying the high voltage request signal to the switch 21, thereby deactivating the switch 21, stopping the supply of the erasing/writing voltage $V_{pp}$ to the flash memory 14, and disabling contents of the flash memory 14 to be erased or written.

Then, at step ST8, the CPU 12 restarts the execution of the subroutine program based on the command from the host microcomputer 10, which has been loaded into the flash memory 14. Since the erasing/writing voltage $V_{pp}$ has not been supplied from the flash memory 14 since step ST7, contents in the flash memory 14 may be protected against false erasing or writing. Consequently, although the subroutine program is read directly from the flash memory 14 without using the RAM 15, the subroutine program will not run away.

After execution of the subroutine program, the CPU 12 writes numeral zero into bit 0 of the control register 19 at step ST9. Writing numeral zero into bit 0 means stopping the supply of the executing status signal to the AND gate circuit 20 thereafter. Bits 0 and 1 of the control register 19 are thus initialized. Then, the CPU 12 sends at step ST10 the host microcomputer 10 a response signal indicating the completion of the procedure based on the command, and the main program routine ends.

The determination at step ST3 is negative if there is no request for erasing or writing with respect to the flash memory 14. In this case, the main program routine proceeds from step ST3 to step ST11. At step ST11, the CPU 12 continues the subroutine program procedure based on the command from the host microcomputer 10 while reading the subroutine program from the flash memory 14. After completion of the execution of the subroutine program, the CPU 12 writes numeral zero into bit 0 of the control register 19 at step ST9, and sends a response signal to the host microcomputer 10 at step ST10. Then, the main program routine ends.

As described above, by virtue of the first embodiment, it is possible to remarkably reduce false entries into erasing or writing mode since the AND gate circuit 20 and the switch 21 enable the erasing/writing voltage $V_{pp}$ to be supplied to the flash memory 14 only when both of the executing status signal, which indicates that the main program triggered by a command is currently being executed, and the EW request signal are present. Although either the executing status signal or the EW request signal accidentally exists for malfunction, the flash memory 14 does not enter erasing mode or writing mode unless the other signal also exists. Therefore, false erasing or writing of contents of the flash memory 14 may be reduced or prevented effectively, and the program being currently read from the flash memory 14 may be restrained from running away.

Especially, in the first embodiment, since the supply of high voltage request signal is controlled by the AND gate circuit 20 that is hardware, there is very little likelihood to enter erasing mode or writing mode although the program causes malfunctioning.

Second Embodiment.

Figure 5:
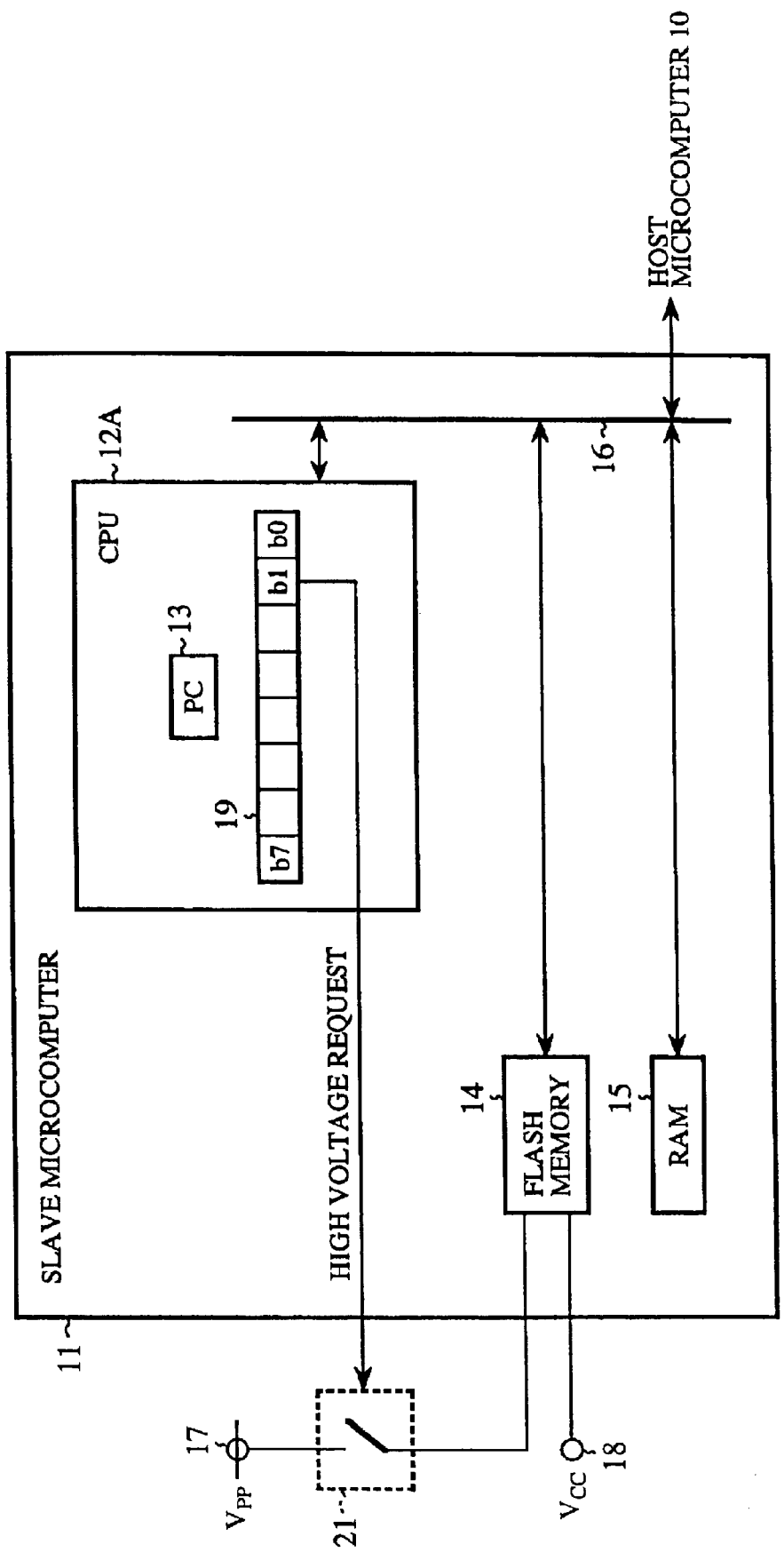
FIG. 5 is a block diagram showing details of hardware of a slave microcomputer according to a second embodiment of the present invention.

FIG. 5 is a block diagram showing details of hardware of another slave microcomputer 11 that is a part of a multiprocessor system according to a second embodiment of the present invention. This slave microcomputer 11 includes a CPU 12A that acts as a processor, setting element, and erasing/writing voltage supply enabler. Similarly to the above-described CPU 12, the CPU 12A is located at the single-chip slave microcomputer 11 where a flash memory 14 and a RAM 15 are also situated, and includes a program counter 13 and a control register 19.

As similar to the slave microcomputer of the first embodiment, the slave microcomputer 11 in FIG. 5 serves in combination with the host microcomputer 10, whereby they comprise a multiprocessor system (see FIGS. 1 and 2). In FIG. 5, the same reference symbols are used to identify elements commonly illustrated in FIG. 3, and they will not be described in detail.

The AND gate circuit 20 in the first embodiment is not used in this embodiment. Instead, the CPU 12A generates the high voltage request signal (in more general meaning, erasing/writing voltage request signal) for activating the switch 21 on the basis of contents of its inside control register 19 in accordance with a program. Operations of the switch 21 will be described below in more detail.

As similar to the first embodiment, in advance of executing the main program, the CPU 12A writes numeral one into a predetermined bit, e.g., bit 0 (abbreviated to b0 in FIG. 5). Directly before the end of execution of the main program, the CPU 12A writes numeral zero into the predetermined bit, e.g., bit 0. Consequently, for most of the period of the execution of the main program, bit 0 retains numeral one continually. The numeral one on bit 0 of the control register 19 can be considered as a flag, i.e., the executing status signal.

In addition, the CPU 12A determines whether or not a subroutine program that is being executed by the CPU 12A on the basis of the command requires erasing or writing with respect to the flash memory 14. If the determination is affirmative, the CPU 12A writes numeral one into a predetermined bit, e.g., bit 1 (abbreviated to b1 in FIG. 5). When the necessity of erasing or writing contents of the flash memory 14 becomes null, the CPU 12A writes numeral zero into the bit, e.g., bit 1. Consequently, insofar as erasing or writing is required with respect to the flash memory 14, bit 1 retains numeral one continually. The numeral one on bit 1 of the control register 19 can be considered as a flag, i.e., the EW request signal.

The CPU 12A generates the high voltage request signal and supplies it to the switch 21 only when numeral one is retained at both of bits 1 and 0 of the control register 19. In other words, the CPU 12A closes or activates the switch 21 only when both of the EW request signal and executing status signal are present. Consequently, only when two conditions are satisfied, the erasing/writing voltage $V_{pp}$ is supplied from the erasing/writing voltage terminal 17 to the flash memory 14. Such operations of the CPU 12A are carried out in line with the main program, and thus the switch 21 is controlled by software.

Figure 6:
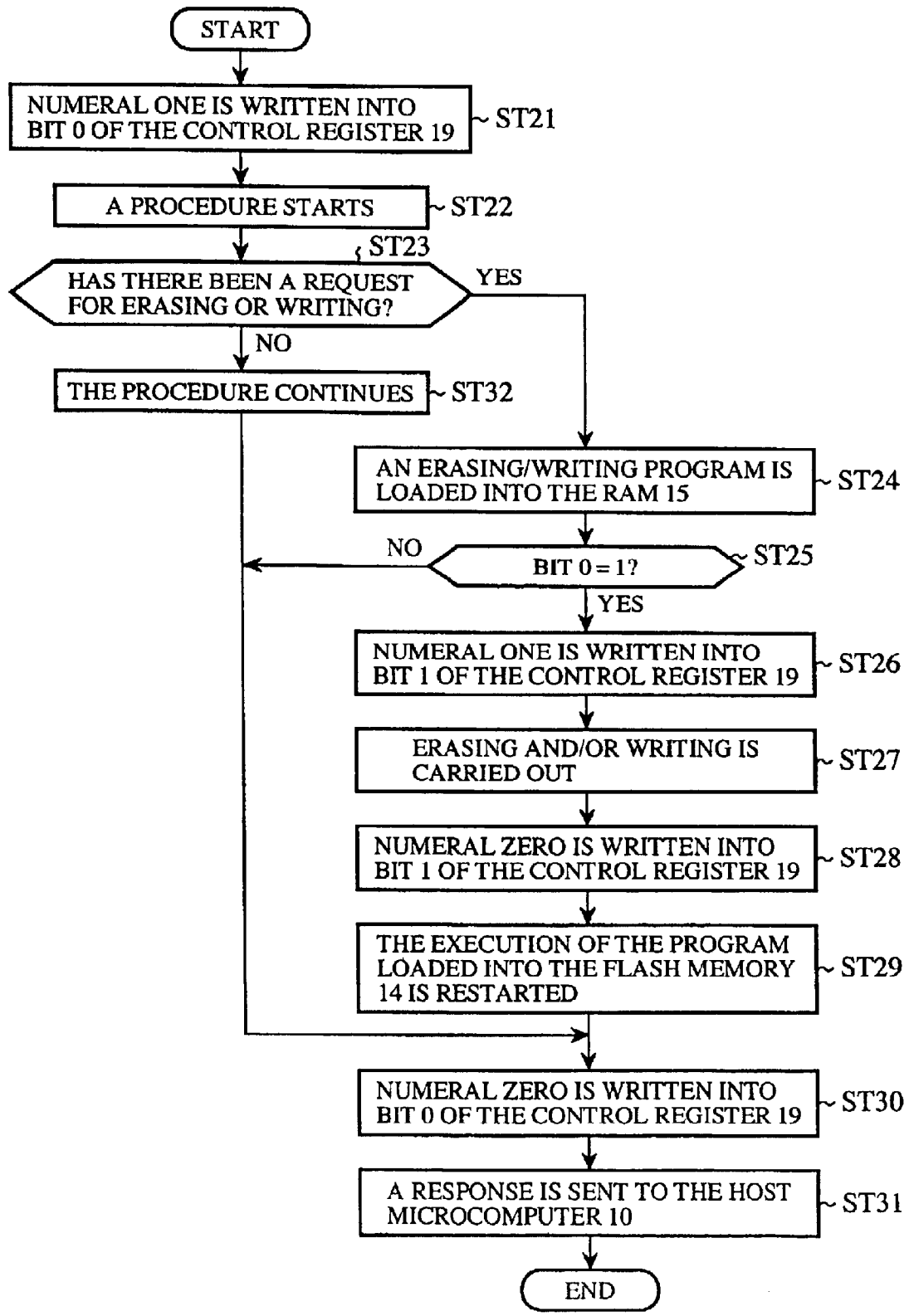
FIG. 6 is a flowchart illustrating a main program routine of a slave microcomputer in FIG. 5.

In order to realize simpler operations, it can be contemplated that only bit 1 (b1) of the control register 19 is connected with the activation terminal of the switch 21 and numeral one can be written into bit 1 only when bit 0 (b0) retains numeral one. In this case, unless bit 0 retains numeral 1 as the executing status signal, numeral one is not written into bit 1 as the EW request signal. In other words, writing numeral one into bit 1 means that the two conditions are satisfied. Consequently, numeral one written into bit 1 as the EW request signal of itself can be used as the high voltage request signal. The main program, which will be explained with reference to FIG. 6, is based on this contemplation.

Although the control register 19 in FIG. 5 includes eight bits: b0 through b7, it may include another suitable number of bits. In addition, it is not intended to limit the present invention to the use of bits 1 and 0 for supplying the EW request signal and executing status signal, and instead, other bits may be used. It is also possible to use bit 1 for the executing status signal and bit 0 for the EW request signal on the contrary to the illustrated embodiment.

Next, operations will be described with reference to the flowchart in FIG. 6. FIG. 6 is a flowchart illustrating a main program routine of the slave microcomputer 11 according to this embodiment. This main program starts whenever the CPU 12 of the slave microcomputer 11 receives a command from the host microcomputer 10. Preferably, the main program illustrated in FIG. 6 is loaded from the flash memory 14 to the RAM 15, and then executed.

First, at step ST21, the CPU 12 writes numeral one as the executing status signal into bit 0 of the control register 19.

Next, the CPU 12A starts a procedure of a subroutine program based on the command at step ST22. More specifically, the CPU 12A retrieves the subroutine program from the flash memory 14 in accordance with the command from the host microcomputer 10, and commences executing the subroutine program. The CPU 12A then determines, at step ST23, whether or not there has been a request for erasing or writing contents of the flash memory 14. At step ST23, the CPU 12A may decide whether or not the subroutine program includes such a request.

If there is a request for erasing or writing and the determination at step ST23 is affirmative, the main program routine proceeds to step ST24. At step ST24, the CPU 12A reads an erasing/writing subroutine program (erasing/writing program) from the flash memory 14 and loads it into the RAM 15.

Next, at step ST25, the CPU 12A confirms or determines whether or not bit 0 of the control register 19 retains numeral one. Only if the determination is affirmative, the main program routine proceeds to step ST26 where the CPU 12A writes numeral one as the EW request signal into bit 1 of the control register 19. As described above, numeral one on bit 1 is utilized as the high voltage request signal. In other words, by writing numeral one into bit 1, the high voltage request signal is continually given to the switch 21 afterward. The high voltage request signal activates the switch 21, whereby the erasing/writing voltage $V_{pp}$ is supplied from the erasing/writing voltage terminal 17 to the flash memory 14, enabling contents of the flash memory 14 to be erased or written.

Next, the CPU 12A erases contents from the flash memory 14 or writes contents into the flash memory 14 at step ST27. This step is carried out by executing the erasing/writing program, which has been loaded into the RAM 15 since step ST15.

After completion of step ST27, the CPU 12A writes numeral zero into bit 1 of the control register 19 at step ST28. Writing numeral zero into bit 1 means that the necessity of erasing or writing contents of the flash memory 14 becomes null thereafter, and hence the high voltage request signal is no longer supplied to the switch 21. Writing numeral zero into bit 1 deactivates the switch 21, thereby stopping the supply of the erasing/writing voltage $V_{pp}$ to the flash memory 14, and disabling contents of the flash memory 14 to be erased or written.

Then, the CPU 12A restarts the execution of the subroutine program based on the command from the host microcomputer 10, which has been loaded into the flash memory 14. Since the erasing/writing voltage $V_{pp}$ has not been supplied from the flash memory 14 since step ST28, contents in the flash memory 14 may be protected against false erasing or writing. Consequently, although the subroutine program is read directly from the flash memory 14 without using the RAM 15, the subroutine program will not run away.

After execution of the subroutine program, the CPU 12A writes numeral zero into bit 0 of the control register 19 at step ST30. Writing numeral zero into bit 0 means the rescission of the executing status signal. Bits 0 and 1 of the control register 19 are thus initialized. Then, the CPU 12A sends at step ST31 the host microcomputer 10 a response signal indicating the completion of the procedure based on the command, and the main program routine ends.

The determination at step ST25 is negative if numeral one as the executing status signal is not retained on bit 0 of the control register 19 by a fault. In this case, the main program routine proceeds to step ST30 where the CPU 12A writes numeral zero into bit 0 of the control register 19 as a posterior process. Then, the CPU 12A sends a response signal to the host microcomputer 10, and then this main program routine ends. In this case, the response signal indicates that the procedure needed by the command has not been accomplished.

The determination at step ST23 is negative if there is no request for erasing or writing with respect to the flash memory 14. In this case, the main program routine proceeds from step ST23 to step ST32. At step ST32, the CPU 12A continues the subroutine program procedure based on the command from the host microcomputer 10 while reading the subroutine program from the flash memory 14. After completion of the execution of the subroutine program, the CPU 12A writes numeral zero into bit 0 of the control register 19 at step ST30, and sends a response signal to the host microcomputer 10 at step ST31. Then, the main program routine ends.

As described above, by virtue of the second embodiment, it is possible to remarkably reduce false entries into erasing or writing mode since the CPU 12A and the switch 21 enable the erasing/writing voltage $V_{pp}$ to be supplied to the flash memory 14 only when both of the executing status signal, which indicates that the main program triggered by a command is currently being executed, and the EW request signal exist. Therefore, false erasing or writing of contents of the flash memory 14 may be reduced or prevented effectively, and the program being currently read from the flash memory 14 may be restrained from running away.

Third Embodiment.

Figure 7:
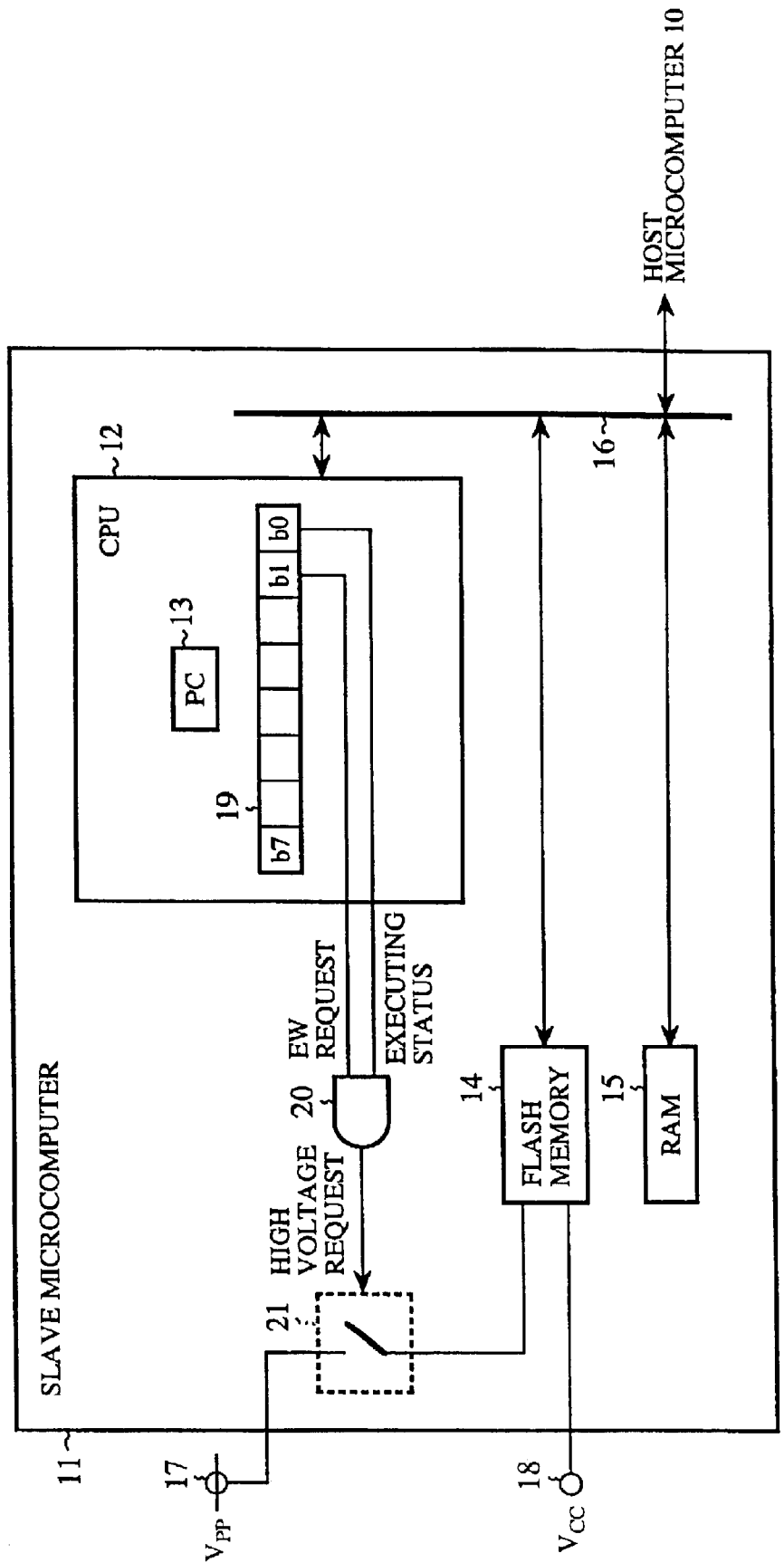
FIG. 7 is a block diagram showing details of hardware of a slave microcomputer according to a third embodiment of the present invention.

FIG. 7 is a block diagram showing details of hardware of another slave microcomputer 11 that is a part of a multiprocessor system according to a third embodiment of the present invention. In FIG. 7, the same reference symbols are used to identify elements commonly illustrated in FIG. 3, and they will not be described in detail.

The slave microcomputer 11 according to the third embodiment is different from the slave microcomputer 11 according to the first embodiment, in that the switch 21 is located within the single-chip slave microcomputer 11. By locating the switch 21 within the single-chip slave microcomputer 11, it is unnecessary to output the high voltage request signal (in more general meaning, erasing/writing voltage request signal) to any element outside the slave microcomputer 11, so that the number of terminals may be decreased. In addition, it is difficult for an improper monitor to tap operational mode of the slave microcomputer 11 since the high voltage request signal is not output exteriorly from the slave microcomputer 11.

If operational mode of the slave microcomputer 11 is tapped by an improper monitor, contents of the flash memory 14 are likely to be rewritten unduly. For example, if power supply is blocked abruptly in writing mode wherein a high voltage is given to the flash memory 14, data in the flash memory 14 may be disturbed or transformed. This embodiment may reduce the possibility of the risk.

As described above, by virtue of the third embodiment, by locating the switch 21 within the single-chip slave microcomputer 11, the number of terminals may be decreased and it is difficult for an improper monitor to tap operational mode of the slave microcomputer 11.

Although the third embodiment is a modification of the first embodiment, the second embodiment illustrated in FIG. 5 may be modified in the same manner so that the switch 21 is located within the slave microcomputer 11.

Fourth Embodiment.

Figure 8:
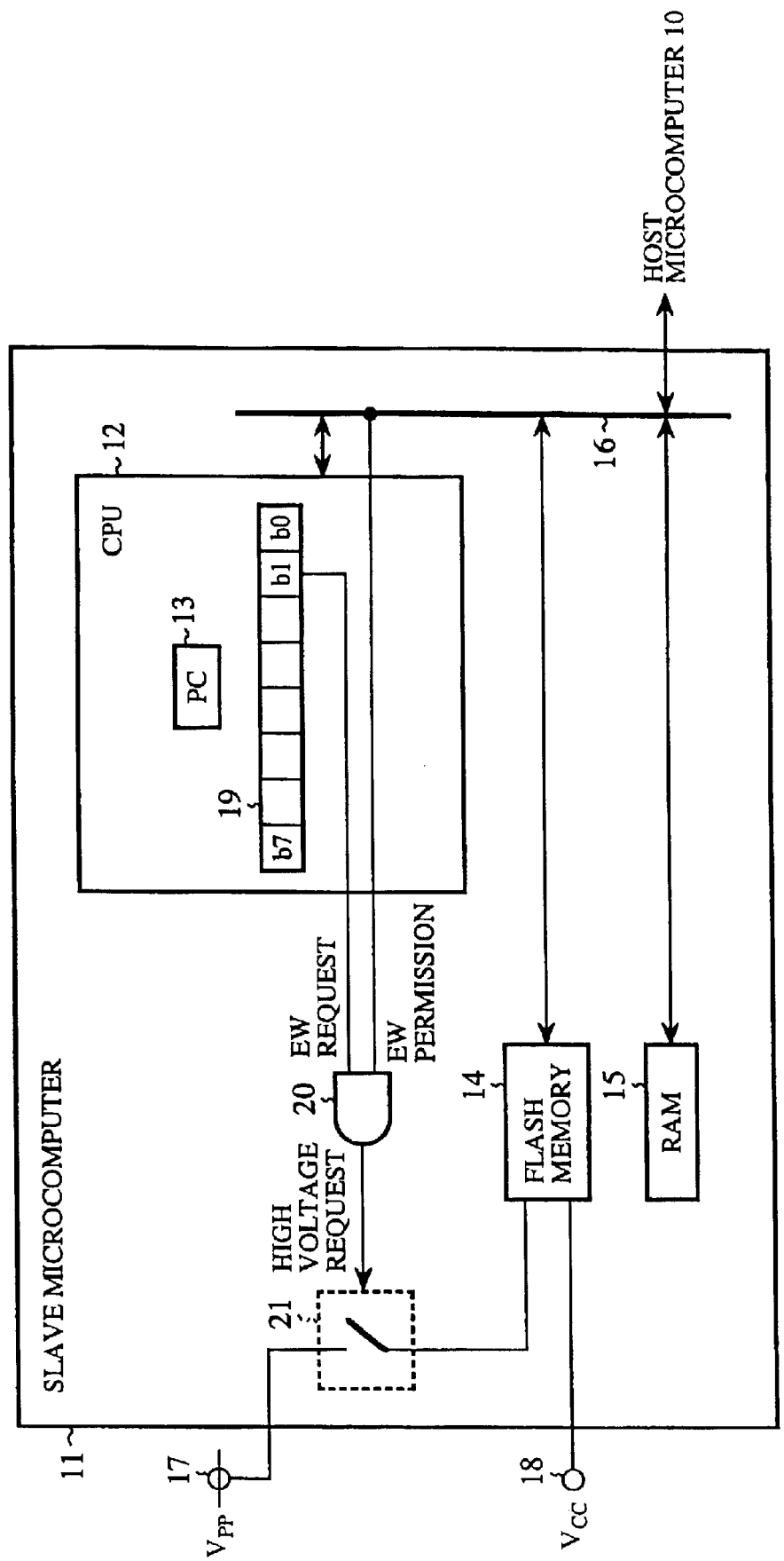
FIG. 8 is a block diagram showing details of hardware of a slave microcomputer according to a fourth embodiment of the present invention.

FIG. 8 is a block diagram showing details of hardware of another slave microcomputer 11 that is a part of a multiprocessor system according to a fourth embodiment of the present invention. As similar to the slave microcomputer of the first embodiment, the slave microcomputer 11 in FIG. 8 serves in combination with the host microcomputer 10, whereby they comprise a multiprocessor system (see FIGS.

1 and 2). In FIG. 8, the same reference symbols are used to identify elements commonly illustrated in FIG. 3, and they will not be described in detail.

On the contrary to the first embodiment in FIG. 3, an erasing/writing permission signal (EW permission signal) is issued by the host microcomputer (second setting element) 10 and is supplied to the AND gate circuit 20 in accordance with this embodiment. In addition, the switch 21 is located within the single-chip slave microcomputer 11.

Next, operations will be described. In this embodiment, the EW permission signal from the host microcomputer 10 is used instead of the executing status signal that is used in the first embodiment. The host microcomputer 10 starts supplying the EW permission signal to the slave microcomputer 11 simultaneously with (or directly before or after) sending a command to the slave microcomputer 11. Unless the host microcomputer 10 receives the response signal (see FIG. 2) indicating the completion of the procedure needed by the command, the host microcomputer 10 continues to provide the slave microcomputer 11 with the EW permission signal. In another embodiment, the EW permission signal may be supplied insofar as the host microcomputer 10 supplies a command that requires the slave microcomputer 11 to erase contents from or write contents into the flash memory 14.

The EW permission signal is supplied to one of input terminals of the AND gate circuit 20 while the other input terminal of the AND gate circuit 20 is connected with bit 1 (b1) of the control register 19 of the CPU (first setting element) 12. As similar to the first embodiment, bit 1 of the control register 19 may retain numeral one as the EW request signal used by the AND gate circuit 20. However, it is not intended to limit the bit for supplying the EW request signal to bit 1, and another bit may be also used instead of bit 1.

The AND gate circuit 20 supplies the high voltage request signal (in more general meaning, erasing/writing voltage request signal) to the switch 21 when both of the EW request signal and EW permission signal are input thereto. In other words, when bit 1 of the control register 19 retains numeral one and the host microcomputer 10 receives the EW permission signal from the host microcomputer 10, the AND gate circuit 20 closes or activates the switch 21. Consequently, only when two conditions are satisfied, the erasing/writing voltage $V_{pp}$ is supplied from the erasing/writing voltage terminal 17 to the flash memory 14.

The main program routine of the slave microcomputer 11 according to this embodiment is similar to that described in conjunction with the first embodiment with reference to FIG. 4. However, since the EW permission signal from the host microcomputer 10 is substituted for the executing status signal, steps ST1 and ST9 in FIG. 4 are unnecessary.

If there is a request for erasing or writing contents of the flash memory 14, the CPU 12 writes numeral one into bit 1 of the control register 19 for giving the AND gate circuit 20 the EW request signal continually, and erases and/or writes contents of the flash memory 14 (step ST3 through step ST6). Once the slave microcomputer 11 returns a response signal at step ST10, the host microcomputer 10 stops the supply of the EW permission signal to the slave microcomputer 11.

As described above, by virtue of the fourth embodiment, it is possible to remarkably reduce false entries into erasing or writing mode since the AND gate circuit 20 and the switch 21 enable the erasing/writing voltage $V_{pp}$ to be supplied to the flash memory 14 only when both of the EW permission signal from the host microcomputer 10 and the EW request signal generated by the slave microcomputer 11 exist. Although the host microcomputer 10 accidentally supplies the EW permission signal for malfunction, the flash memory 14 does not enter erasing mode or writing mode unless the slave microcomputer 11 generates the EW request signal. Contrarily, although the slave microcomputer 11 generates the EW request signal falsely, the flash memory 14 does not enter erasing mode or writing mode unless the host microcomputer 10 supplies the EW permission signal. Therefore, false erasing or writing of contents of the flash memory 14 may be reduced or prevented effectively, and the program being currently read from the flash memory 14 may be restrained from running away.

In addition, by locating the switch 21 in the single-chip slave microcomputer 11, the number of terminals may be decreased and it is difficult for an improper monitor to tap operational mode of the slave microcomputer 11.

Figure 9:
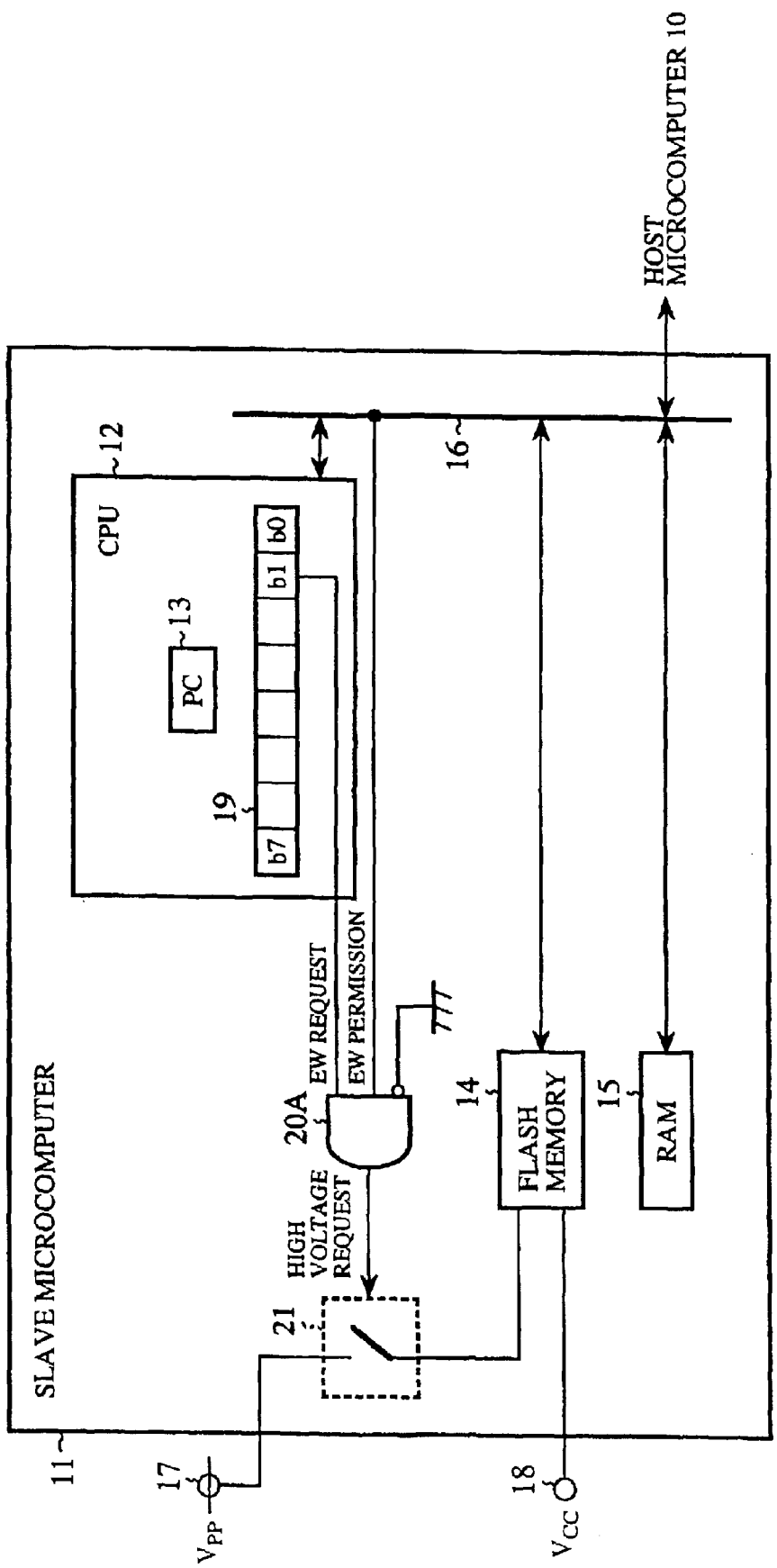
FIG. 9 is a block diagram showing a slave microcomputer of a variation of the fourth embodiment.

FIG. 9 shows another slave microcomputer 11 of a variation of the fourth embodiment. The slave microcomputer 11 includes an AND gate circuit (erasing/writing voltage supply enabler) 20A with three input terminals. The EW permission signal can be supplied from the host microcomputer 10 to one of the input terminals of the AND gate circuit 20A. The EW request signal can be supplied to another input terminal of the AND gate circuit 20 from the CPU 12. The other input terminal of the AND gate circuit 20 is a reverse input terminal grounded. Since a low level potential is always given to the reverse input terminal, the AND gate circuit 20A supplies a high voltage request signal (in more general meaning, erasing/writing voltage request signal) to the switch 21 when inputs are given to other two input terminals. Therefore, the slave microcomputer 11 in FIG. 9 may be used as similar to the slave microcomputer 11 according to the fourth embodiment in FIG. 8.

Figure 10:
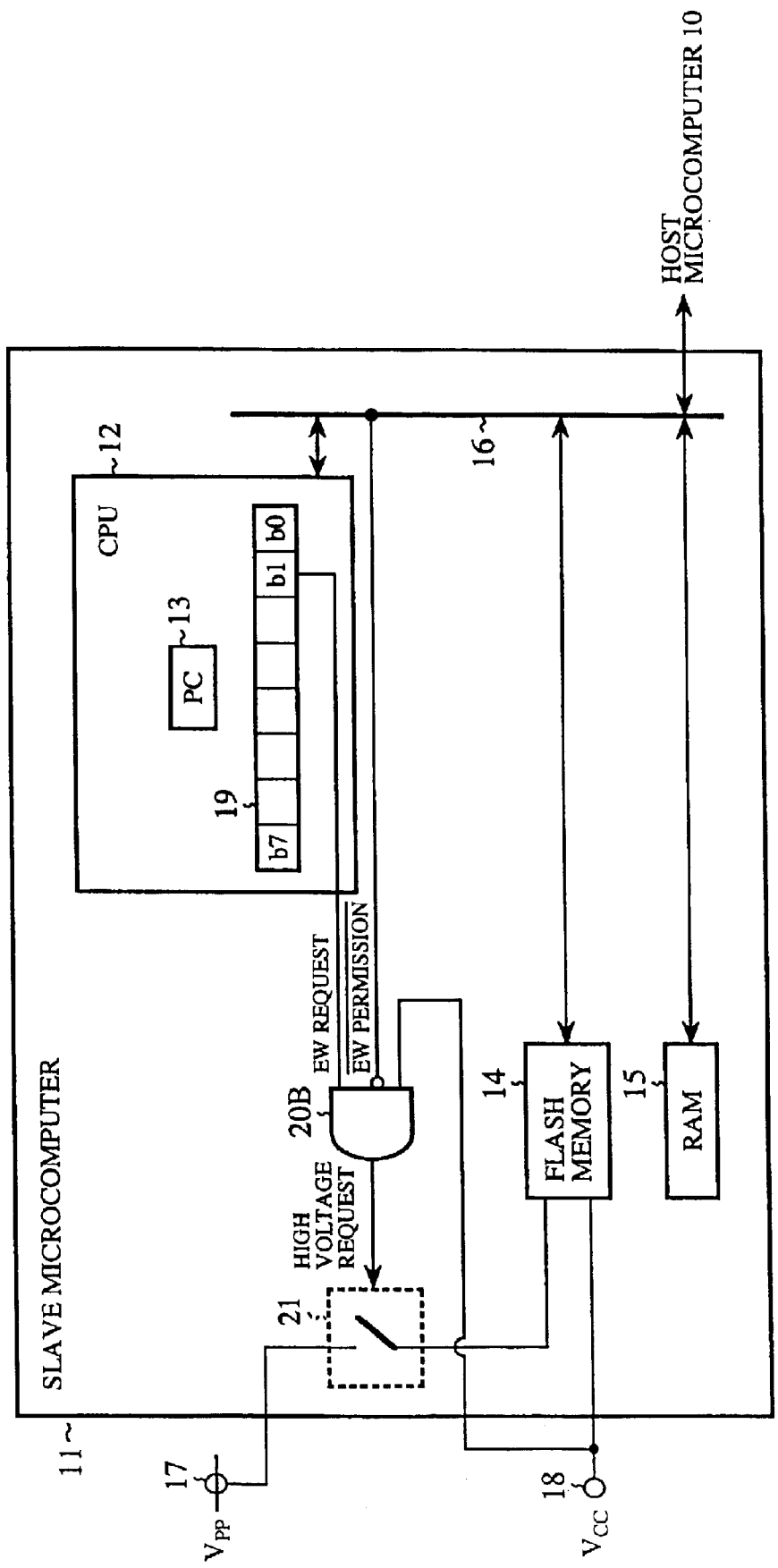
FIG. 10 is a block diagram showing another slave microcomputer of another variation of the fourth embodiment.

FIG. 10 shows another slave microcomputer 11 of another variation of the fourth embodiment. The slave microcomputer 11 includes an AND gate circuit (erasing/writing voltage supply enabler) 20B having three input terminals. One of input terminals of the AND gate circuit 20B is a reverse input terminal to which a negative-logic (inverted) EW request signal can be supplied from the host microcomputer 10. The EW permission signal can be supplied to another input terminal of the AND gate circuit 20B from the CPU 12. The other input terminal of the AND gate circuit 20B is connected with the reading voltage terminal 18, so as to always receive the reading voltage. Accordingly, the AND gate circuit 20B supplies a high voltage request signal (in more general meaning, erasing/writing voltage request signal) to the switch 21 when other two input terminals receive the inverted EW permission signal and the EW request signal, respectively. Therefore, the slave microcomputer 11 in FIG. 10 may be also used as similar to the slave microcomputer 11 according to the fourth embodiment in FIG. 8.

Fifth Embodiment.

Next, a fifth embodiment of the present invention will be described. The multiprocessor system including the host microcomputer 10 and the slave microcomputer 11 shown in FIG. 1 is also used in the fifth embodiment. In this multiprocessor system, erasing and writing contents of the flash memory in the slave microcomputer 11 is controlled only by instructions from the host microcomputer 10.

The details of hardware of the slave microcomputer 11 according to this embodiment are the same as those of the first embodiment or the third embodiment illustrated in FIG. 3 or 7. However, generation process of each of the EW request signal and executing status signal is different from that in the first or third embodiment.

Figure 11:
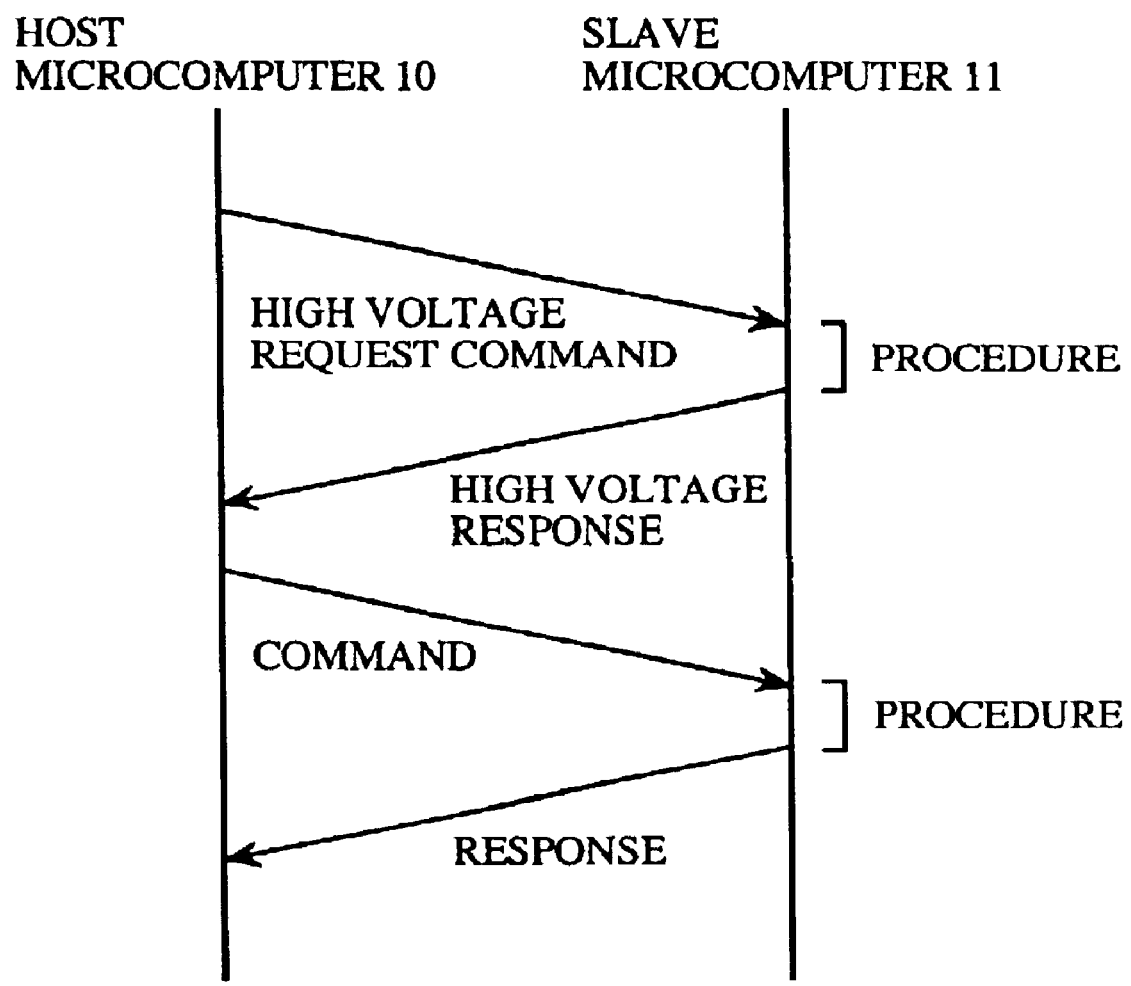
FIG. 11 is control flow sequence diagram showing a schematic operation in a multiprocessor system according to a fifth embodiment of the present invention.

Next, operations will be described. As shown in FIG. 11, the host microcomputer 10 can supply a high voltage request command (in more general meaning, erasing/writing voltage request command) to the slave microcomputer 11 according to this embodiment. The high voltage request command is issued in advance of the transmission of a command, which requires erasing or writing contents of the flash memory 14, from the host microcomputer 10 to the slave microcomputer 11. When any commands that do not require erasing or writing are supplied to the slave microcomputer 11, the host microcomputer 10 does not issue the high voltage request command.

Upon receiving the high voltage request command from the host microcomputer 10, the CPU 12 of the slave microcomputer 11 executes a procedure to generate an executing status signal. More specifically, the CPU 12 writes numeral one into a predetermined bit, e.g., bit 0 (abbreviated to b0 in FIGS. 3 and 7) of the control register 19. Numeral one at bit 0 of the control register 19 is used as the executing status signal by the AND gate circuit 20. After completion of the procedure, as shown in FIG. 11, the CPU 12 returns a high voltage response signal (in more general meaning, erasing/writing voltage response signal) to the host microcomputer 10. Upon receiving the high voltage response signal, the host microcomputer 10 transmits the slave microcomputer 11 a subject command to be transmitted.

In connection with the slave microcomputer 11, the command received after the high voltage request from the host microcomputer 10 needs erasing or writing contents of the flash memory 14. Upon receiving the command, the CPU 12 executes a procedure required by the command and generates the EW request signal. More specifically, the CPU 12 writes numeral one into a predetermined bit, e.g., bit 1 (abbreviated to b1 in FIGS. 3 and 7) of the control register 19. Numeral one at bit 1 of the control register 19 is used as the EW request signal by the AND gate circuit 20.

The AND gate circuit 20 supplies the high voltage request signal to the switch 21 when both of the EW request signal and executing status signal are supplied thereto. In other words, numeral one is retained at bits 1 and 0 of the control register 19, the AND gate circuit 20 closes or activates the switch 21. Consequently, only when two conditions are satisfied, the erasing/writing voltage $V_{pp}$ is supplied from the erasing/writing voltage terminal 17 to the flash memory 14.

Thus, contents of the flash memory 14 become to be erased or written. After completion of the procedure needed by the subject command, as shown in FIG. 11, the CPU 12 returns a response signal to the host microcomputer 10.

Figure 12:
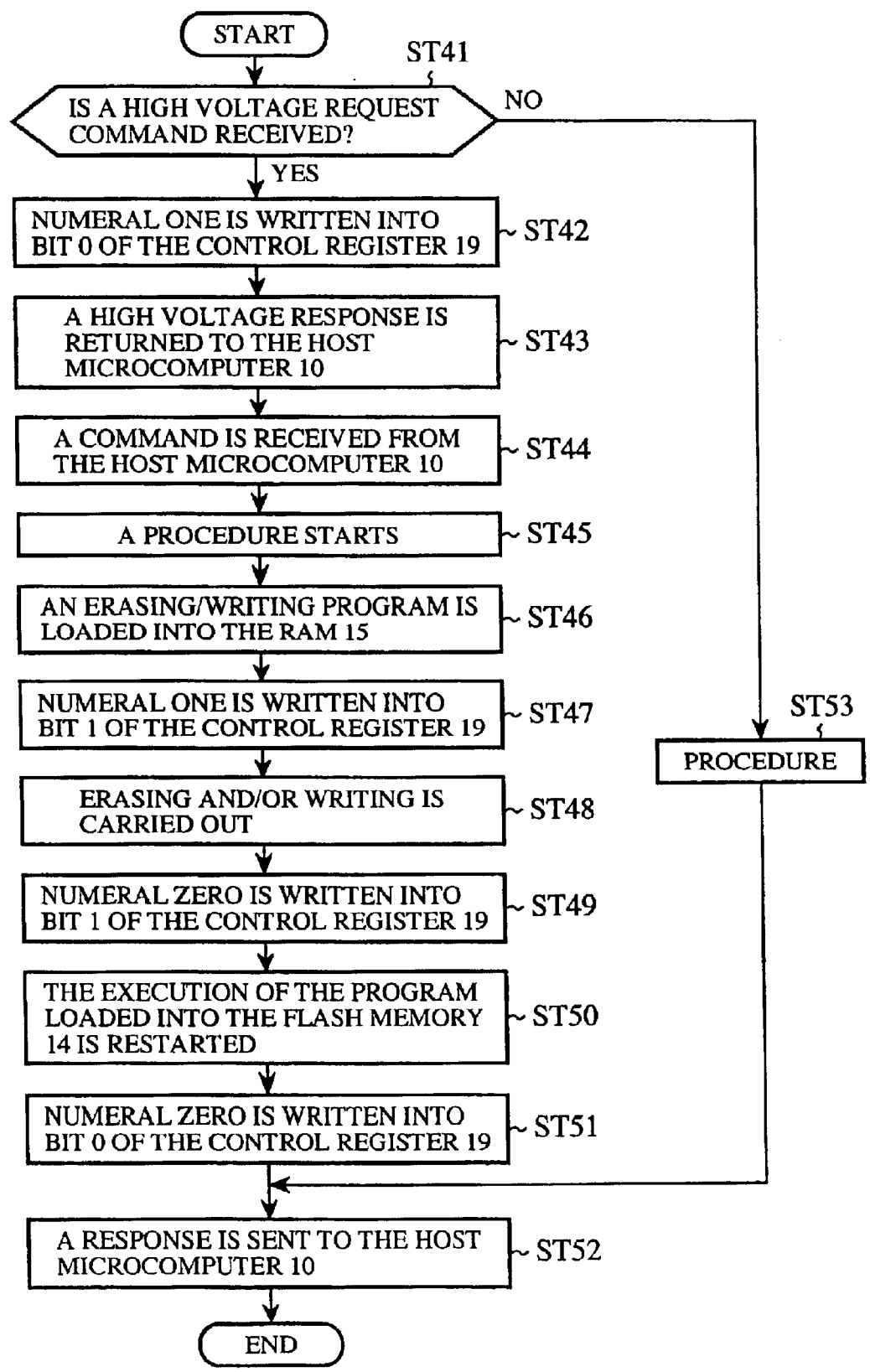
FIG. 12 is a flowchart illustrating a main program routine of a slave microcomputer according to the fifth embodiment.

Next, operations will be described with reference to the flowchart illustrated in FIG. 12. FIG. 12 illustrates a main program routine of a slave microcomputer 11 according to the fifth embodiment. The main program starts whenever the CPU 12 of the slave microcomputer 11 receives a command from the host microcomputer 10. Preferably, the main program illustrated in FIG. 12 is loaded from the flash memory 14 to the RAM 15, and then executed.

First, the CPU 12 determines whether or not the command received from the host microcomputer 10 is a high voltage request command at step ST41. If the determination is affirmative, the main program routine proceeds to step ST42 where the CPU 12 writes numeral one into bit 0 of the control register 19. As described above, writing numeral one into bit 0 means continually giving the executing status signal to the AND gate circuit 20.

After writing numeral one into bit 0, the CPU 12 returns the high voltage response signal to the host microcomputer 10 at step ST43. In response, the host microcomputer 10 sends the subject command to be transmitted (which needs erasing or writing contents of the flash memory 14) to the slave microcomputer 11. At step ST44, the slave microcomputer 11 receives the command from the host microcomputer 10.

Next, at step ST45, the CPU 12 commences a procedure of a subroutine program needed by the subject command. More specifically, the CPU 12 retrieves the subroutine program on the basis of the command from the flash memory 14, and then starts executing the subroutine program.

The received command at step ST44 involves a request for erasing or writing with respect to the flash memory 14. Accordingly, after completion of the procedure of step ST45, the CPU 12 reads an erasing/writing subroutine program (erasing/writing program) from the flash memory 14 and loads it into the RAM 15 at step ST46.

The CPU 12 writes numeral one into bit 1 of the control register 19 at step ST47. As described above, writing numeral one into bit 1 means continually giving the EW request signal to the AND gate circuit 20 afterward. The executing status signal has been already supplied to the AND gate circuit 20 since bit 0 has retained numeral one since step ST42, the AND gate circuit 20 supplies the high voltage request signal to the switch 21 in response to the newly added EW request signal and the executing status signal. The switch 21 is thus activated, whereby the erasing/writing voltage $V_{pp}$ is given to flash memory 14 from the erasing/writing voltage terminal 17, so as to enable contents of the flash memory 14 to be erased or written.

Next, the CPU 12 erases contents from the flash memory 14 and/or writes contents into the flash memory 14 at step ST48. This step is carried out by executing the erasing/writing program, which has been loaded into the RAM 15 since step ST46.

After completion of step ST48, the CPU 12 writes numeral zero into bit 1 of the control register 19 at step ST49. Writing numeral zero into bit 1 means that the necessity of erasing or writing contents of the flash memory 14 becomes null thereafter, and hence the EW request signal is no longer necessary to be supplied to the AND gate circuit 20. Directly after writing numeral zero into bit 1, the AND gate circuit 20 stops supplying the high voltage request signal to the switch 21, thereby deactivating the switch 21, stopping the supply of the erasing/writing voltage $V_{pp}$ to the flash memory 14, and disabling contents of the flash memory 14 to be erased or written.

Then, at step ST50, the CPU 12 restarts the execution of the subroutine program based on the command from the host microcomputer 10, which has been loaded into the flash memory 14. Since the erasing/writing voltage $V_{pp}$ has not been supplied from the flash memory 14 since step ST49, contents in the flash memory 14 may be protected against false erasing or writing. Consequently, although the subroutine program is read directly from the flash memory 14 without using the RAM 15, the subroutine program will not run away.

After execution of the subroutine program, the CPU 12 writes numeral zero into bit 0 of the control register 19 at step ST51. Writing numeral zero into bit 0 means stopping the supply of the executing status signal to the AND gate circuit 20 thereafter. Bits 0 and 1 of the control register 19 are thus initialized. Then, the CPU 12 sends at step ST52 the host microcomputer 10 a response signal indicating the completion of the procedure based on the command, and the main program routine ends.

The determination at step ST41 is negative when the command received from the host microcomputer 10 is neither the high voltage request command nor a command that accompanies a request for erasing or writing with respect to the flash memory 14. In this case, the main program routine proceeds from step ST41 to step ST53. At step ST53, the CPU 12 executes a subroutine program based on the command from the host microcomputer 10 while reading the subroutine program from the flash memory 14. After completion of the execution of the subroutine program, the CPU 12 sends a response signal to the host microcomputer 10 at step ST52, and then the main program routine ends.

As described above, by virtue of the fifth embodiment, it is possible to remarkably reduce false entries into erasing or writing mode since the AND gate circuit 20 and the switch 21 enable the erasing/writing voltage $V_{pp}$ to be supplied to the flash memory 14 only when both of the executing status signal, which indicates the reception of the high voltage request command, and the EW request signal, which indicates the next command involves a request for erasing or writing with respect to the flash memory 14, are present. Although the host microcomputer 10 malfunctions, the flash memory 14 does not enter erasing or writing mode unless the host microcomputer 10 supplies two commands for activating both of the executing status signal and the EW request signal. Therefore, false erasing or writing of contents of the flash memory 14 may be reduced or prevented effectively, and the program being currently read from the flash memory 14 may be restrained from running away.

As described above, the slave microcomputer 11 may be the same as that of the first or third embodiment illustrated in FIG. 3 or 7. As shown in FIG. 7, if the switch 21 is built in the single-chip slave microcomputer 11, the number of terminals may be decreased and it is difficult for an improper monitor to tap operational mode of the slave microcomputer 11.

Sixth Embodiment.

Figure 13:
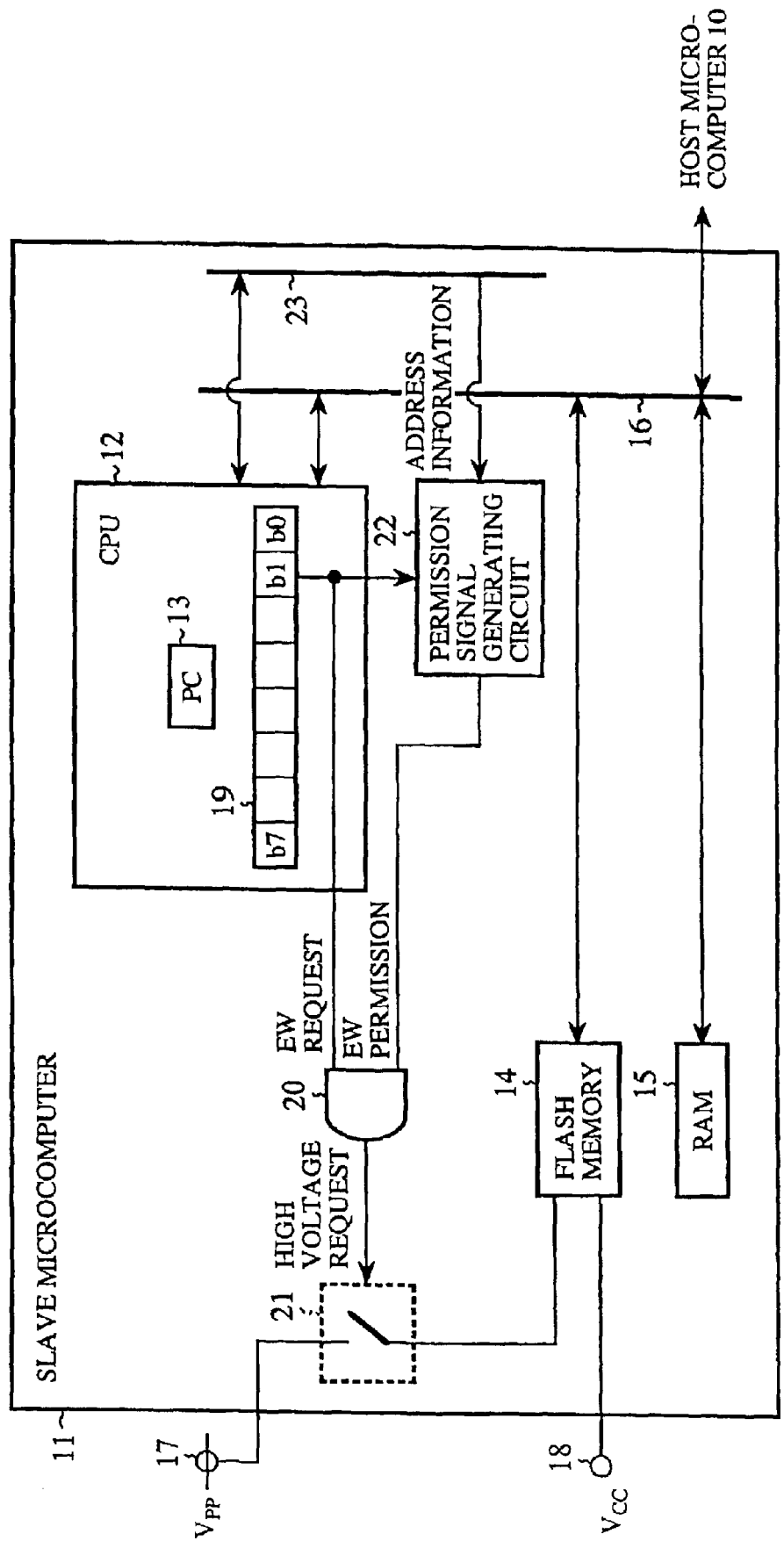
FIG. 13 is a block diagram showing details of hardware of a slave microcomputer according to a sixth embodiment of the present invention.

FIG. 13 is a block diagram showing details of hardware of another slave microcomputer 11 that is a part of a multiprocessor system according to a sixth embodiment of the present invention. The slave microcomputer 11 includes a permission signal generating circuit 22 as a second setting element and an address bus 23. The slave microcomputer 11 shown in FIG. 13 is also used in combination with the host microprocessor 10, whereby they comprise a multiprocessor system as similar to the slave microcomputer of the first embodiment (see FIGS. 1 and 2). In FIG. 13, the same reference symbols are used to identify elements commonly illustrated in FIG. 3, and they will not be described in detail.

The slave microcomputer 11 according to this embodiment is of a single chip configuration, and includes the permission signal generating circuit 22 that is independent from CPU (first setting element) 12 and the address bus 23 within the single-chip. The permission signal generating circuit 22 is not controlled directly by the CPU 12 and operates indirectly on the basis of a signal generated by the CPU 12. In an example, the permission signal generating circuit 22 may include a CPU, which is different from the CPU 12, for selectively providing the AND gate circuit 20 with an erasing/writing permission signal (EW permission signal) on the basis of signals input thereto.

Next, operations will be described. As similar to the first embodiment, the CPU 12 produces the EW request signal when it is necessary to erase contents from or write contents into the flash memory 14. For example, the CPU 12 may write numeral one into a predetermined bit, e.g., bit 1 (b1) of the control register (first setting element) 19 therein. This bit of the register is connected not only with one of input terminals of the AND gate circuit 20, but also with the permission signal generating circuit 22. Consequently, the permission signal generating circuit 22 may monitor whether or not the EW request signal is present.

The permission signal generating circuit 22 is connected with the address bus 23 connected with the CPU 12. Accordingly, the address bus 23 may monitor address information via the address bus 23 about the resources, e.g., the flash memory 14 and the RAM 15, accessed by the CPU 12.

The CPU 12 designates the RAM 15 as the accessed resource into which an erasing/writing program is loaded when the CPU 12 produces the EW request signal. In this case, the CPU 12 drives the address bus 23 to indicate an address on the RAM 15. Consequently, if the EW request signal is present, it is normal that the address information indicating an address on the RAM 15 is monitored by the permission signal generating circuit 22 via the address bus 23. The permission signal generating circuit 22 produces the EW permission signal and supplies it to the AND gate circuit 20 only when the EW request signal exists and when the permission signal generating circuit 22 receives the address information indicating an address of the RAM 15. The permission signal generating circuit 22 is provided with a storage (not shown) for storing or retaining comparative address information on all available addresses on the RAM 15, so as to capable of deciding whether or not the address information on the address bus 23 indicates an address of the RAM 15.

The AND gate circuit 20 supplies the high voltage request signal (in more general meaning, erasing/writing voltage request signal) to the switch 21 when both of the EW request signal and EW permission signal are input thereto. In other words, when bit 1 of the control register 19 retain numeral one and the CPU 12 designates address information on an suitable address for erasing or writing contents of the flash memory 14, the AND gate circuit 20 closes or activates the switch 21. Consequently, only when two conditions are satisfied, the erasing/writing voltage $V_{pp}$ is supplied from the erasing/writing voltage terminal 17 to the flash memory 14. Thus, the permission signal generating circuit 22 confirms the operational normality of the CPU 12 by address information indicating the resource to which the CPU 12 accesses.

In light of the purpose of the above-described operation, it is possible to consider the provision of the AND gate circuit 20 is redundant. In a modified embodiment, the AND gate circuit 20 may be excluded. In such a modified embodiment, the EW permission signal from the permission signal generating circuit may be used for the high voltage request signal, so that the switch 21 may be closed or activated if the EW permission signal is supplied to the switch 21.

The main program routine for the CPU 12 of the slave microcomputer 11 according to the sixth embodiment resembles that illustrated in FIG. 4 and described in conjunction with the first embodiment. However, since the address information is substituted for the executing status signal, steps ST1 and ST9 in FIG. 4 are unnecessary. In addition, as will be understood from the above description, the CPU 12 drives the address bus 23 to indicate the address information designating an address on the RAM 15 directly before or after loading the erasing/writing program into the RAM 15 (step ST4). At step ST5, writing numeral one into bit 1 of the control register 19 causes the permission signal generating circuit 22 to output the EW permission signal, thereby enabling contents of the flash memory 14 to be erased and/or written.

As described above, by virtue of the sixth embodiment, it is possible to remarkably reduce false entries into erasing or writing mode since the permission signal generating circuit 22, which operates independently of the CPU 12, enables the erasing/writing voltage $V_{pp}$ to be supplied to the flash memory 14 only when the operation of the CPU 12 is normal. Although either errant address information designating an address on the RAM 15 or the EW request signal exists for malfunction, the flash memory 14 does not enter erasing mode or writing mode unless the other also exists. Therefore, false erasing or writing of contents of the flash memory 14 may be reduced or prevented effectively, and the program being currently read from the flash memory 14 may be restrained from running away.

In the sixth embodiment, the operational normality of the CPU 12 is confirmed on the basis of the address information designating the resource to which the CPU 12 accesses, but the operational normality of the CPU 12 may be confirmed in another manner. In an alternative embodiment, the permission signal generating circuit 22 may monitor, instead of the address information on the address bus 23, data on the bus (data bus) 16, so as to determine whether or not the sequence of instructions of the above-described subroutine program executed by the CPU 12 is normal. If the sequence is determined to be normal, the CPU 12 may output the EW permission signal. In order to realize the alternative embodiment, the CPU 12 or the host microcomputer 10 may notify the permission signal generating circuit 22 of the sequence of instructions and the permission signal generating circuit 22 stores or retains the sequence.

In this alternative embodiment, the permission signal generating circuit 22 may confirm the sequence of instructions after the CPU 12 has detected a request for erasing or writing. However, it is not intended to limit the present invention to this manner, the permission signal generating circuit 22 may verify the sequence of instructions before the detection of the request for erasing or writing by the CPU 12, whereby operational stability of the slave microcomputer 11 can be enhanced.

In another alternative embodiment, the permission signal generating circuit 22 may monitor information at a built-in interface of the slave microcomputer 11 for exchanging information with the host microcomputer 10. For example, the permission signal generating circuit 22 may determine whether or not a response signal sent from the slave microcomputer 11 to the host microcomputer 10 is in consistency with a command sent from the host microcomputer 10 to the slave microcomputer 11. The permission signal generating circuit 22 may output the EW permission signal when the consistency is normal.

Seventh Embodiment.

Figure 14:
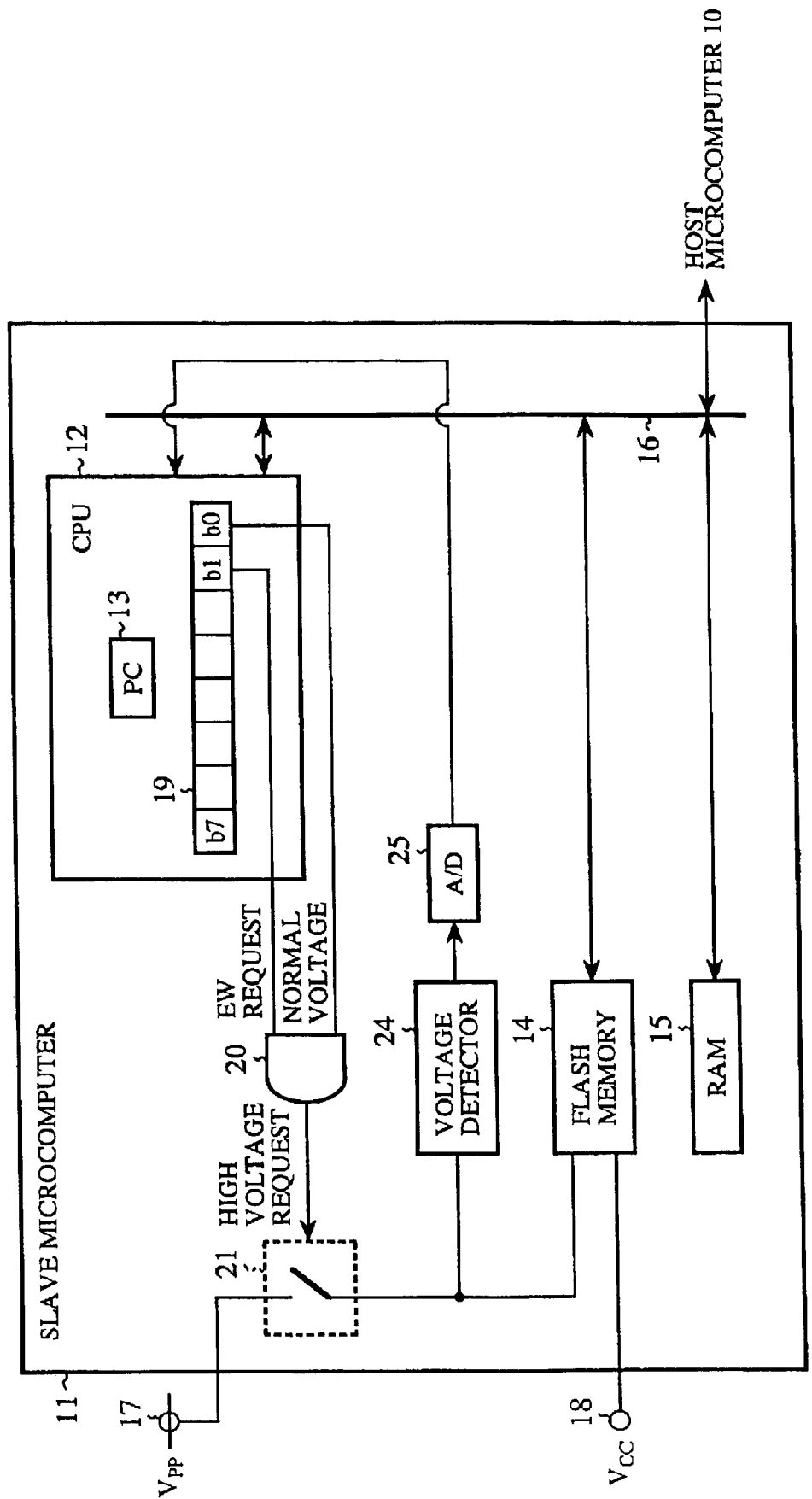
FIG. 14 is a block diagram showing details of hardware of a slave microcomputer according to a seventh embodiment of the present invention.

FIG. 14 is a block diagram showing details of hardware of another slave microcomputer 11 that is a part of a multiprocessor system according to a seventh embodiment of the present invention. The slave microcomputer 11 includes a voltage detector or voltage measurer 24 and an analog-to-digital converter (A/D converter) 25. The slave microcomputer 11 in FIG. 14 also serves in combination with the host microcomputer 10, whereby they comprise a multiprocessor system as similar to the slave microcomputer of the first embodiment (see FIGS. 1 and 2). In FIG. 14, the same reference symbols are used to identify elements commonly illustrated in FIG. 3, and they will not be described in detail.

The slave microcomputer 11 of the embodiment is of a single chip configuration and contains the voltage detector 24 and the A/D converter 25 within the single-chip. The voltage detector 24 measures the erasing/writing voltage $V_{pp}$ during the switch 21 is activated to supply the voltage $V_{pp}$ from the erasing/writing voltage terminal 17 to the flash memory 14. The A/D converter 25 converts the analog voltage amount measured by the voltage detector 24 into a digital signal, which is supplied to the CPU 12.

On the basis of the digital voltage signal from the A/D converter 25, the CPU 12 determines whether the supplied erasing/writing voltage is within a normal range or not. If the determination is affirmative, the CPU 12 produces a normal voltage signal.

More specifically, when a normal voltage is detected, the CPU 12 writes numeral one into a predetermined bit, e.g., bit 1 (b1) of the control register 19 within the CPU 12 or leaves numeral one into the predetermined bit if this bit has already retained numeral one. This bit of the register is connected with one of input terminals of the AND gate circuit 20. If the erasing/writing voltage is abnormal, the CPU 12 writes numeral zero into the bit. Consequently, insofar as the erasing/writing voltage $V_{pp}$ from the erasing/writing voltage terminal 17 is within the normal range, bit 0 continually retains numeral one. Numeral one on bit 0 of the control register 19 is used as a flag, i.e., the normal voltage signal by the AND gate circuit 20.

In addition, the CPU 12 produces the EW request signal when it is necessary to erase contents from or write contents into the flash memory 14 as similar to the first embodiment. For example, the CPU 12 may write numeral one into a predetermined bit, e.g., bit 1 (b1) of the control register 19 within the CPU 12.

The AND gate circuit 20 supplies a high voltage request signal (in more general meaning, erasing/writing voltage request signal) to the switch 21 when both of the EW request signal and normal voltage signal are input thereto. In other words, when bits 1 and 0 of the control register 19 retain numeral one, the AND gate circuit 20 closes or activates the switch 21. Consequently, only when two conditions are satisfied, the erasing/writing voltage $V_{pp}$ is supplied from the erasing/writing voltage terminal 17 to the flash memory 14.

However, unless the switch 21 is closed, the voltage detector 24 cannot measure the voltage. Therefore, the CPU 12 writes numeral one into bit 0 of the control register 19 for the normal voltage signal whenever the CPU 12 writes numeral one into bit 1 for the EW request signal in order to activate the switch 21 to measure the voltage. If the erasing/writing voltage $V_{pp}$ becomes abnormal, the supply of erasing/writing voltage $V_{pp}$ is stopped since the CPU 12 stops the normal voltage signal.

While the switch 21 may be located outside the slave microcomputer 11, it is preferably located within the single-chip slave microcomputer 11 as illustrated. With the illustrated structure, the number of terminals may be decreased and it is difficult for an improper monitor to tap operational mode of the slave microcomputer 11.

Figure 15:
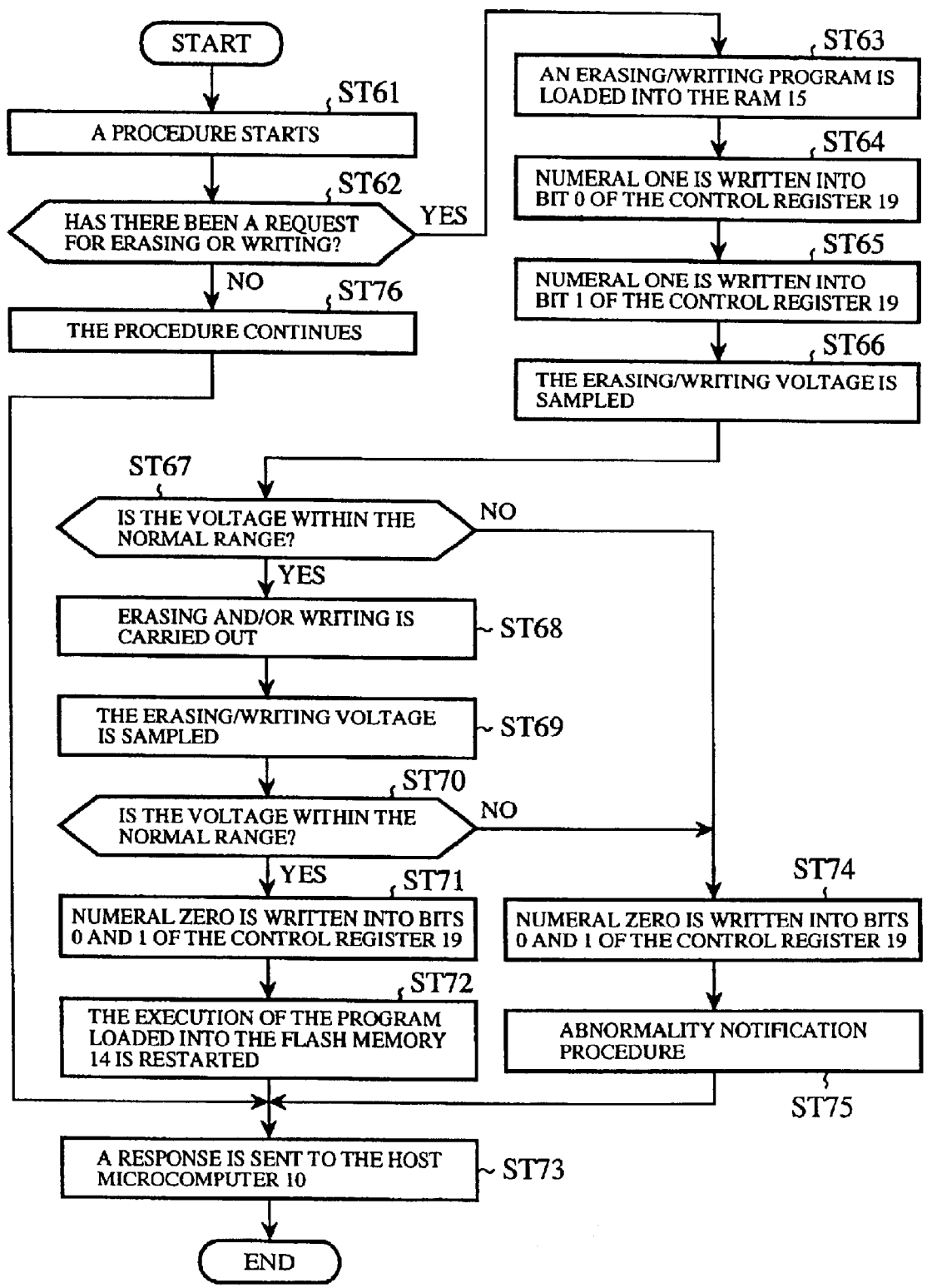
FIG. 15 is a flowchart illustrating a main program routine of a slave microcomputer in FIG. 14.

Next, operations will be described with reference to the flowchart illustrated in FIG. 15. FIG. 15 shows a main program routine of the slave microcomputer 11 according to this embodiment. This main program starts whenever the slave microcomputer 11 receives a command from the host microcomputer 10. Preferably, the main program in FIG. 15 is loaded from the flash memory 14 into the RAM 15, and then executed.

First, the CPU 12 starts a procedure of a subroutine program according to the command from the host microcomputer 10 at step ST61. More specifically, the CPU 12 retrieves the subroutine program from the flash memory 14 in accordance with the command from the host microcomputer 10, and commences executing the subroutine program.

The CPU 12 then determines, at step ST62, whether or not there has been a request for erasing or writing contents of the flash memory 14. At step ST62, the CPU 12 may decide whether or not the subroutine program includes such a request.

If there is a request for erasing or writing and the determination at step ST62 is affirmative, the main program routine proceeds to step ST63. At step ST63, the CPU 12 reads an erasing/writing subroutine program (erasing/writing program) from the flash memory 14 and loads it into the RAM 15.

The CPU 12 then writes numeral one into bit 0 of the control register 19 at step ST64. As described above, writing numeral one into bit 0 means continuously supplying the normal voltage signal to the AND gate circuit 20 thereafter.

The CPU 12 then writes numeral one into bit 1 of the control register 19 at step ST65. As described above, writing numeral one into bit 1 means continuously supplying the EW request signal to the AND gate circuit 20 thereafter.

The normal voltage signal has been supplied to the AND gate circuit 20 since numeral one has been already retained on bit 0 since step ST64. Therefore, the AND gate circuit 20 commences supplying the high voltage request signal to the switch 21 on the basis of the EW request signal and normal voltage signal. The high voltage request signal activates the switch 21, whereby the erasing/writing voltage $V_{pp}$ is supplied from the erasing/writing voltage terminal 17 to the flash memory 14 for enabling contents of the flash memory 14 to be erased or written.

The CPU 12 samples the digital voltage amount corresponding to the erasing/writing voltage $V_{pp}$ supplied from the A/D converter 25 at step ST66, and determines whether the sampled erasing/writing voltage $V_{pp}$ is within the normal range at step ST67.

If the erasing/writing voltage $V_{pp}$ is normal, the CPU 12 erases contents from and/or writes contents into the flash memory 14 at step ST68. This step is carried out by executing the erasing/writing program, which has been loaded into the RAM 15 since step ST63.

After completion of step ST68, the CPU 12 samples the digital voltage amount corresponding to the erasing/writing voltage $V_{pp}$, again at step ST69. Furthermore, the CPU 12 determines whether the sampled erasing/writing voltage $V_{pp}$ is within the normal range at step ST70.

If the determination at step ST70 is affirmative, the CPU 12 writes numeral zero into bits 0 and 1 at step ST71. Bits 0 and 1 of the control register 19 are thus initialized. Writing numeral zero into bit 0 means stopping the supply of the normal voltage signal to the AND gate circuit 20 thereafter. Writing numeral zero into bit 1 means that the necessity of erasing or writing contents of the flash memory 14 becomes null thereafter, and hence the EW request signal is no longer necessary to be supplied to the AND gate circuit 20. Directly after writing numeral zero into bits 0 and 1, the AND gate circuit 20 stops supplying the high voltage request signal to the switch 21, thereby deactivating the switch 21, stopping the supply of the erasing/writing voltage $V_{pp}$ to the flash memory 14, and disabling contents of the flash memory 14 to be erased or written.

Then, at step ST72, the CPU 12 restarts the execution of the subroutine program based on the command from the host microcomputer 10, which has been loaded into the flash memory 14. Since the erasing/writing voltage $V_{pp}$ has not been supplied from the flash memory 14 since step ST71, contents in the flash memory 14 may be protected against false erasing or writing. Consequently, although the subroutine program is read directly from the flash memory 14 without using the RAM 15, the subroutine program will not run away.

After execution of the subroutine program, the CPU 12 sends at step ST73 the host microcomputer 10 a response signal indicating the completion of the procedure required by the command, and the main program routine ends.

On the other hand, if the erasing/writing voltage $V_{pp}$ is abnormal directly before or after erasing and/or writing, the determination at step ST67 or step ST70 is negative. In this case, the main program routine proceeds to step ST74. At step ST74, the CPU 12 writes numeral zero into bits 0 and 1 of the control register 19. Bits 0 and 1 of the control register 19 are thus initialized. Directly after writing numeral zero into bits 0 and 1, the AND gate circuit 20 stops supplying the high voltage request signal to the switch 21, thereby disabling contents of the flash memory 14 to be erased or written.

The CPU 12 then executes an abnormality notification procedure at step ST75. In the abnormality notification procedure, the CPU 12 generates a notification for notifying the host microcomputer 10 of the occurrence of abnormality. The CPU 12 returns a response signal to the host microcomputer 10 at step ST73, and the main program routine ends. This response signal includes a notification of the occurrence of abnormality, whereby the host microcomputer 10 recognizes the occurrence of abnormality.

If the determination at step ST67 is negative, contents are not erased and/or written with respect to the flash memory 14. Consequently, contents of the flash memory 14 may be protected against renewal at an abnormal voltage. If renewal of contents of the flash memory 14 is attempted at an abnormal voltage, there is likelihood that abnormal data are written into the flash memory 14. This embodiment prevents contents from being renewed at an abnormal voltage, and hence resolves such a drawback.

If the determination at step ST70 is negative, erasing and/or writing contents with respect to the flash memory 14 has been already completed. Such renewal of contents may be carried out at the normal erasing/writing voltage, but the potentiality of renewal at an abnormal voltage cannot be denied categorically. Since the host microcomputer 10 receives the notification of the occurrence of abnormality generated at step ST75, a human operator of this system will appreciate the potentiality that abnormal data are written into the flash memory 14, and thus may take a suitable action.

Furthermore, the determination at step ST62 is negative if erasing or writing with respect to the flash memory 14 has not been requested before step ST62. In this case, the main program routine proceeds from step ST62 to step ST76 where the CPU 12 continues the subroutine program procedure based on the command from the host microcomputer 10 while reading the subroutine program from the flash memory 14. After completion of the execution of the subroutine program, the CPU 12 sends a response signal to the host microcomputer 10 at step ST73, and then the main program routine ends.

As described above, by virtue of the seventh embodiment, it is possible to remarkably reduce false entries into erasing or writing mode since the AND gate circuit 20 and the switch 21 enable the erasing/writing voltage $V_{pp}$ to be supplied to the flash memory 14 only when the erasing/writing voltage $V_{pp}$ to be supplied to the flash memory 14 is normal and when the EW request signal is present. Therefore, false erasing or writing of contents of the flash memory 14 may be reduced or prevented effectively, and the program being currently read from the flash memory 14 may be restrained from running away.

Additionally, since contents of the flash memory 14 may be protected against erasing or rewriting at an abnormal voltage, the flash memory 14 is prevented from writing unexpected abnormal information.

Eighth Embodiment.

Figure 16:
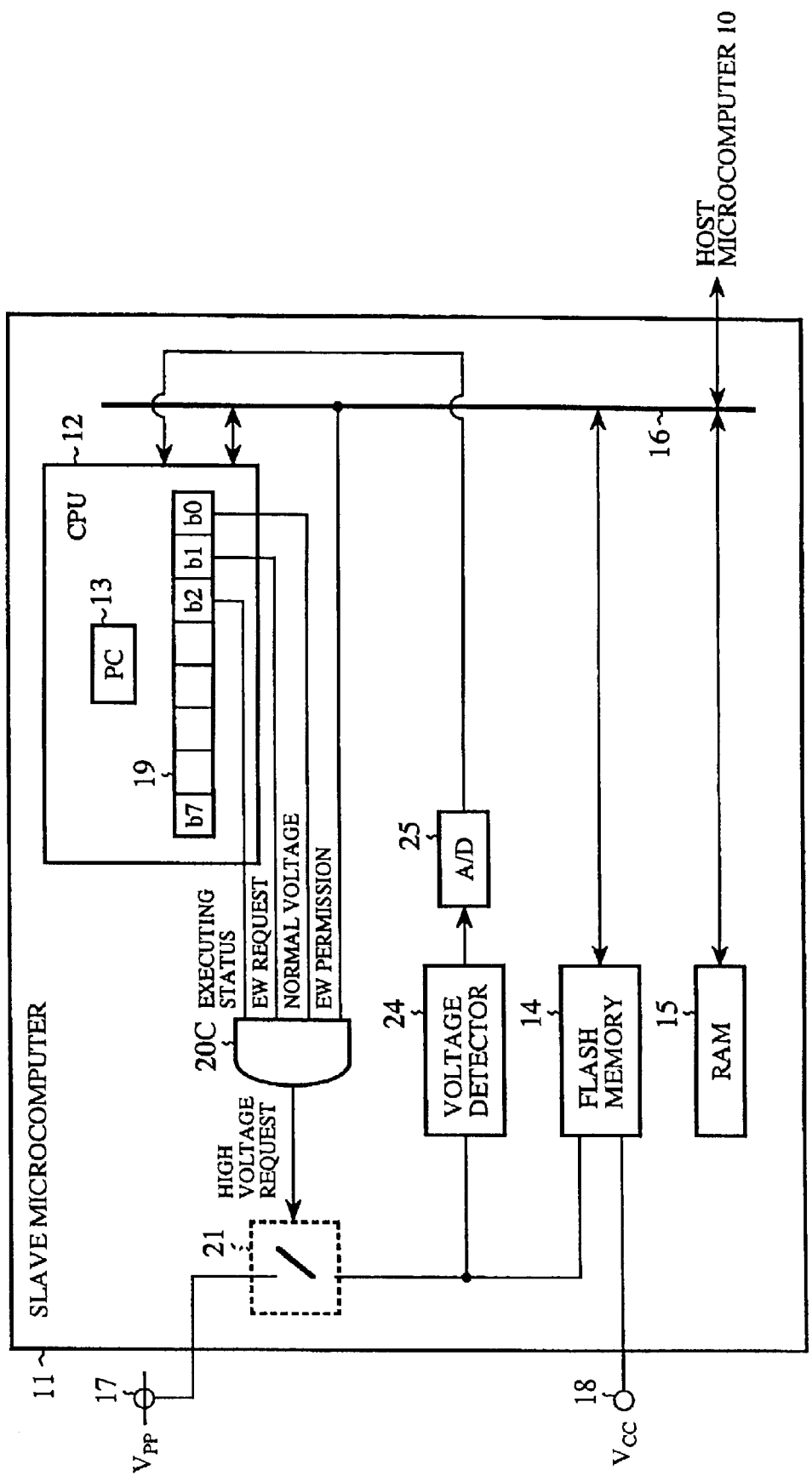
FIG. 16 is a block diagram showing details of hardware of a slave microcomputer according to an eighth embodiment of the present invention.

FIG. 16 is a block diagram showing details of hardware of another slave microcomputer 11 that is a part of a multiprocessor system according to an eighth embodiment of the present invention. The slave microcomputer 11 includes an AND gate circuit 20C that has four input terminals. As similar to the slave microcomputer of the first embodiment, the slave microcomputer 11 in FIG. 16 also serves in combination with the host microcomputer 10, whereby they comprise a multiprocessor system (see FIGS. 1 and 2).

The slave microcomputer 11 according to this embodiment incorporates features of the first embodiment in FIG. 3, the fourth embodiment in FIG. 8, and the seventh embodiment in FIG. 14. In FIG. 16, the same reference symbols are used to identify elements commonly illustrated in those drawings, and they will not be described in detail.

One of four input terminals of the AND gate circuit 20C is connected with bit 2 (b2) of the control register (first and third setting elements) 19 of the CPU (first and third setting elements) 12, so that the executing status signal may be input to this input terminal. Another input terminal of the AND gate circuit 20C is connected with bit 1 (b1) of the control register 19, so that the EW request signal may be input thereto. Still another input terminal of the AND gate circuit 20C is connected with bit 0 (b0) of the control register 19, so that the normal voltage signal can be input thereto. The remaining input terminal of the AND gate circuit 20C is connected with the bus 16, so that the EW permission signal can be input thereto from the host microcomputer (second setting element) 10.

The signals that can be input to the AND gate circuit 20C are produced and supplied in the manners that have been already described in conjunction with the first, fourth, and seventh embodiments. The control register 19 uses three bits (b0 through b2) for retaining three flags: the executing status signal, the EW request signal, and the normal voltage signal that are supplied to the AND gate circuit 20C.

The switch 21 may be located outside the slave microcomputer 11, but preferably located within the single-chip slave microcomputer 11 as illustrated. With the illustrated structure, the number of terminals may be decreased and it is difficult for an improper monitor to tap operational mode of the slave microcomputer 11.

Figure 17:
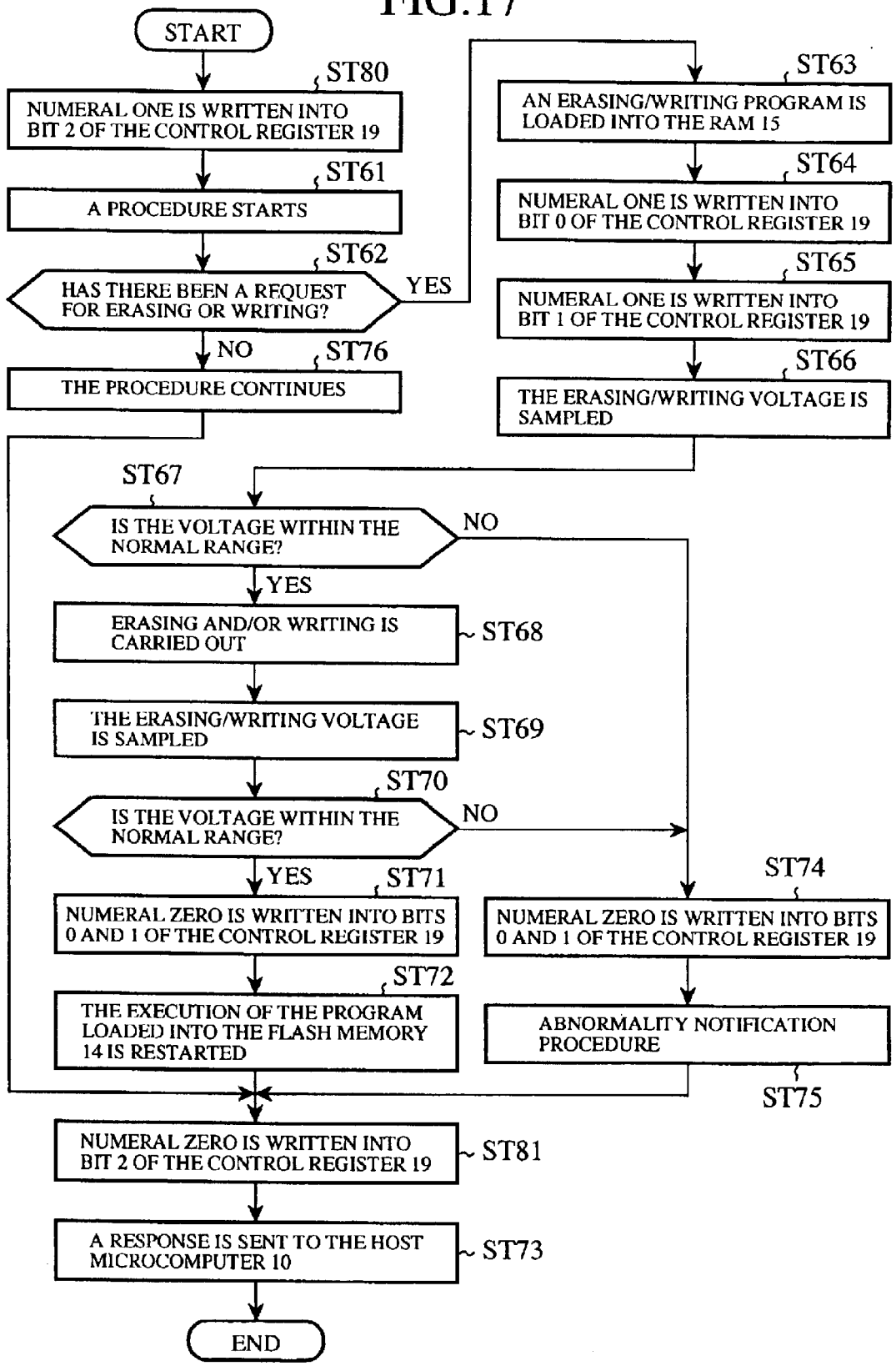
FIG. 17 is a flowchart illustrating a main program routine of a slave microcomputer in FIG. 16.

Next, operations will be described. FIG. 17 is a flowchart illustrating a main program routine of the CPU 12 of the slave microcomputer 11 according to this embodiment. This program includes steps ST80 and ST81 in addition to steps of the main program according to the seventh embodiment illustrated in FIG. 15.

The main program starts whenever the CPU 12 of the slave microcomputer 11 receives a command from the host microcomputer 10. Preferably, the main program illustrated in FIG. 17 is loaded from the flash memory 14 to the RAM 15, and then executed.

First, the CPU 12 writes numeral one into bit 2 (b2) of the control register 19 at step ST80. As will be understood from the above description, writing numeral one into bit 2 means continuously supplying the executing status signal to the AND gate circuit 20 thereafter. After step ST80, the main program routine advances as similar to the aforementioned main program routine illustrated in FIG. 15. Before step ST73, the CPU 12 writes numeral zero into bit 2 (b2) of the control register 19 for initializing bit 2 at step ST81.

According to this embodiment, the AND gate circuit 20C closes the switch 21 for supplying the erasing/writing voltage $V_{pp}$ from the erasing/writing voltage terminal 17 to the flash memory 14 when the executing status signal (bit 2 of the control register 19), the EW request signal (bit 1), and the normal voltage signal (bit 0) are supplied to the AND gate circuit 20C from the control register 19 and when the EW permission signal is supplied to the AND gate circuit 20C from the host microcomputer 10. Consequently, unless four conditions are satisfied, contents of the flash memory 14 are not enabled to be erased or written.

The host microcomputer 10 starts supplying the EW permission signal to the slave microcomputer 11 simultaneously with (or directly before or after) sending a command to the slave microcomputer 11. When the response signal is returned from the CPU 12 at step ST73, the host microcomputer 10 stops supplying the EW permission signal.

When the host microcomputer 10 stops supplying the EW permission signal unexpectedly, the AND gate circuit 20C opens the switch 21 and thus stops supplying the erasing/writing voltage $V_{pp}$ to the flash memory 14 irrespective of progression of the main program. In this case, the voltage is decided to be abnormal at steps ST67 or ST70, the host microcomputer 10 is notified of an abnormality by the response signal sent at step ST73.

As described above, by virtue of the eighth embodiment, unless four conditions are satisfied, contents of the flash memory 14 are not enabled to be erased or written. Therefore, false erasing or writing of contents of the flash memory 14 may be reduced or prevented with higher reliability.

Ninth Embodiment.

Figure 18:
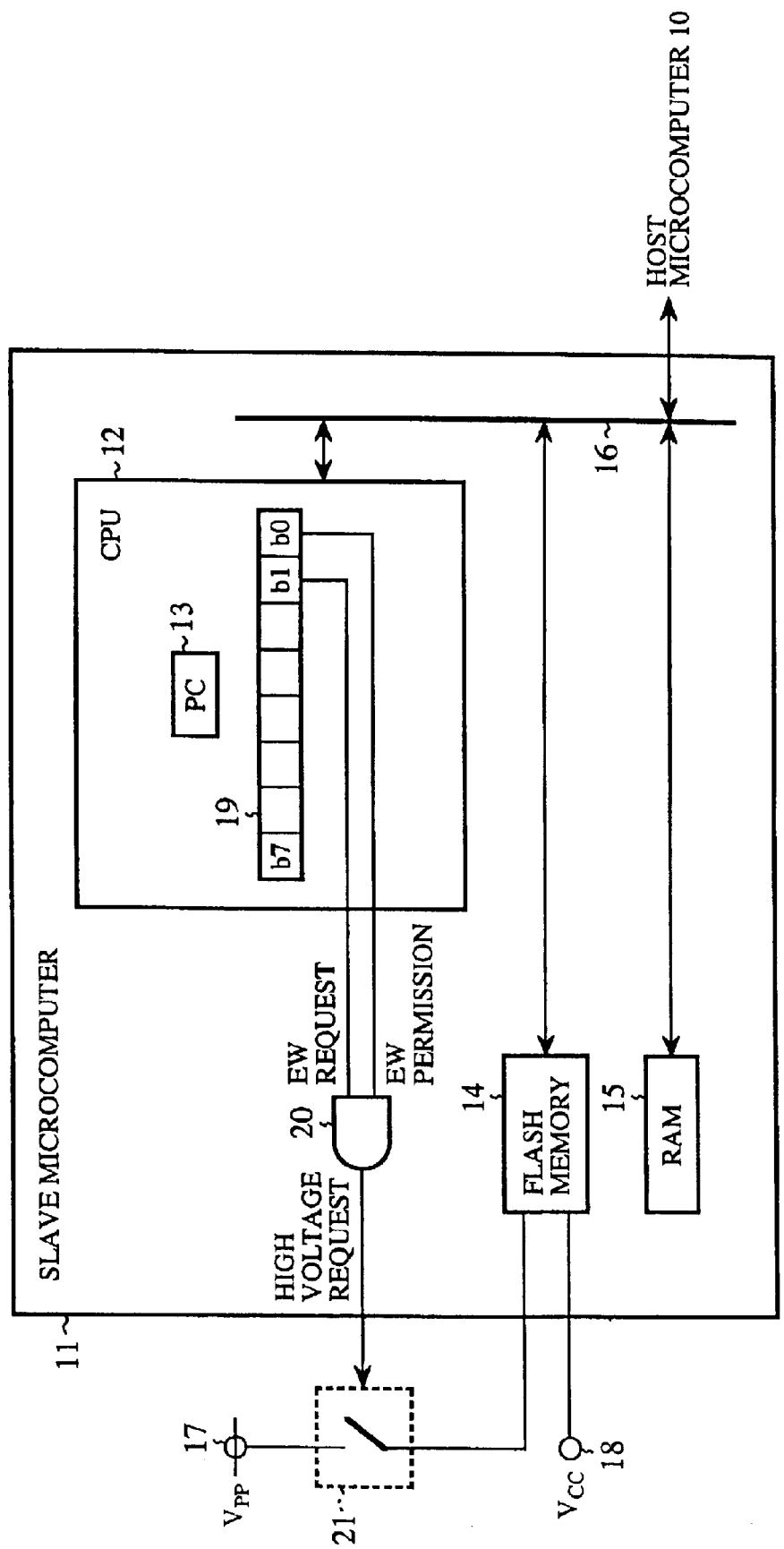
FIG. 18 is a block diagram showing details of hardware of a slave microcomputer according to a ninth embodiment of the present invention.

FIG. 18 is a block diagram showing details of hardware of another slave microcomputer 11 that is a part of a multiprocessor system according to a ninth embodiment of the present invention. As similar to the slave microcomputer of the first embodiment, the slave microcomputer 11 in FIG. 18 also serves in combination with the host microcomputer 10, whereby they comprise a multiprocessor system (see FIGS. 1 and 2). In FIG. 18, the same reference symbols are used to identify elements commonly illustrated in FIG. 3, and they will not be described in detail.

As described above, when a program for erasing or writing with respect to the flash memory 14 is running, the program should be read from the RAM 15 after loading it there since the program should not be read directly from the flash memory 14 in order to prevent the program from running away. In the ninth embodiment, the CPU 12 confirms whether the program is ready to be read from the RAM 15 or not, and the CPU 12 itself generates the EW permission signal when the confirmation result is affirmative.

More specifically, the CPU 12 refers to the program counter 13 within the CPU 12, and decides whether or not the program counter 13 indicates an address on the RAM 15. As described above, the program counter 13 indicates the address of the next instruction to be executed among the running program. If the program counter 13 indicates an address on the RAM 15, the CPU 12 writes numeral one into a predetermined bit, e.g., bit 0 (b0) of the control register 19. This bit of the register is connected with one input terminal of the AND gate circuit 20. After completion of the execution of the erasing/writing program, the CPU 12 writes numeral zero into bit 0 of the control register 19. Numeral one at bit 0 of the control register 19 is used as a flag that is the EW permission signal by the AND gate circuit 20.

In addition, as similar to the first embodiment, the CPU 12 generates the EW request signal when it is necessary to erase contents from or to write contents into the flash memory 14. For example, the CPU 12 may write numeral one into a prescribed bit, e.g., bit 1 (b1) of the control register 19 inside thereof.

The AND gate circuit 20 supplies the high voltage request signal (in more general meaning, erasing/writing voltage request signal) to the switch 21 when both of the EW request signal and the EW permission signal are input thereto. In other words, when bits 0 and 1 of the control register 19 retain one, the AND gate circuit 20 closes or activates the switch 21. Consequently, only when two conditions are satisfied, the erasing/writing voltage $V_{pp}$ is supplied from the erasing/writing voltage terminal 17 to the flash memory 14.

Figure 19:
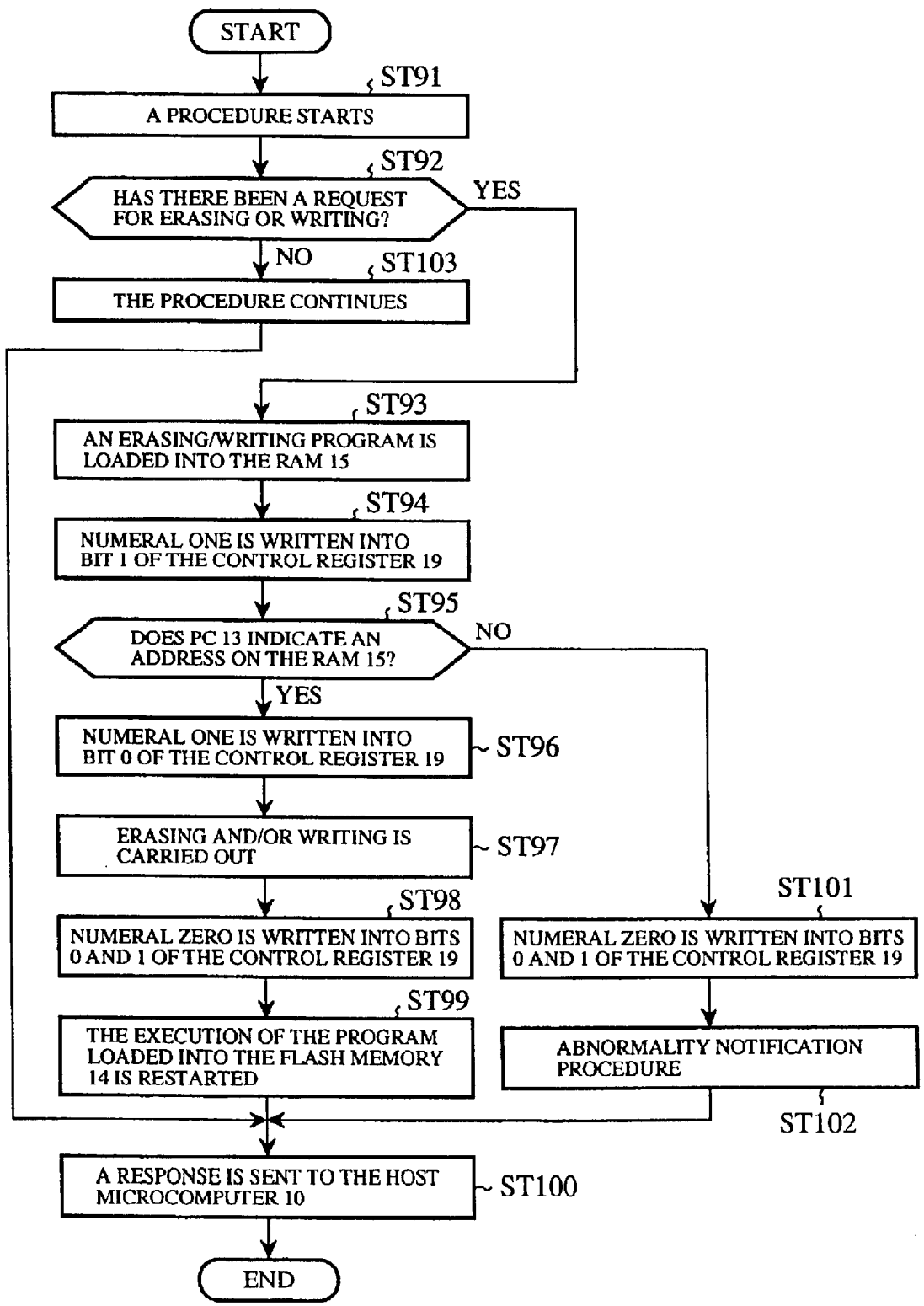
FIG. 19 is a flowchart illustrating a main program routine of a slave microcomputer in FIG. 18.

Next, operations will be described with reference to the flowchart illustrated in FIG. 19. FIG. 19 is a flowchart illustrating a main program routine of the slave microcomputer 11 according to this embodiment. This main program starts whenever the CPU 12 of the slave microcomputer 11 receives from the host microcomputer 10. Preferably, the main program illustrated in FIG. 19 is loaded from the flash memory 14 to the RAM 15, and then executed.

First, the CPU 12 starts a procedure of a subroutine program according to the command from the host microcomputer 10 at step ST91. More specifically, the CPU 12 retrieves the subroutine program from the flash memory 14 in accordance with the command from the host microcomputer 10, and commences executing the subroutine program.

The CPU 12 then determines, at step ST92, whether or not there has been a request for erasing or writing contents of the flash memory 14. At step ST92, the CPU 12 may decide whether or not the subroutine program includes such a request.

If there is a request for erasing or writing and the determination at step ST92 is affirmative, the main program routine proceeds to step ST93. At step ST93, the CPU 12 reads an erasing/writing subroutine program (erasing/writing program) from the flash memory 14 and loads it into the RAM 15.

The CPU 12 then writes numeral one into bit 1 of the control register 19 at step ST94. As described above, writing numeral one into bit 1 means continuously supplying the EW request signal to the AND gate circuit 20 thereafter.

Then, the CPU 12 refers to the program counter (PC) 13 and determines whether or not the program counter 13 indicates an address on the RAM 15 at step ST95.

If the program counter 13 indicates the address on the RAM 15, the determination at step ST95 is affirmative and the CPU 12 writes numeral one into bit 0 of the control register 19 at step ST96. As described above, writing numeral one into bit 0 means continuously supplying the EW permission signal to the AND gate circuit 20 thereafter.

The EW request signal has been supplied to the AND gate circuit 20 since numeral one has been already retained on bit 0 since step ST94. Therefore, the AND gate circuit 20 commences supplying the high voltage request signal to the switch 21 on the basis of the EW request signal and EW permission signal. The high voltage request signal activates the switch 21, whereby the erasing/writing voltage $V_{pp}$ is supplied from the erasing/writing voltage terminal 17 to the flash memory 14 for enabling contents of the flash memory 14 to be erased or written.

Next, the CPU 12 erases contents from and/or writes contents into the flash memory 14 at step ST97. This step is carried out by executing the erasing/writing program, which has been loaded into the RAM 15 since step ST93.

After step ST97, the CPU 12 writes numeral zero into bits 0 and 1 at step ST98. Bits 0 and 1 of the control register 19 are thus initialized. Writing numeral zero into bit 0 means stopping the supply of the EW permission signal to the AND gate circuit 20 thereafter. Writing numeral zero into bit 1 means that the necessity of erasing or writing contents of the flash memory 14 becomes null thereafter, and hence the EW request signal is no longer necessary to be supplied to the AND gate circuit 20. Directly after writing numeral zero into bits 0 and 1, the AND gate circuit 20 stops supplying the high voltage request signal to the switch 21, thereby deactivating the switch 21, stopping the supply of the erasing/writing voltage $V_{pp}$ to the flash memory 14, and disabling contents of the flash memory 14 to be erased or written.

Then, at step ST99, the CPU 12 restarts the execution of the subroutine program based on the command from the host microcomputer 10, which has been loaded into the flash memory 14. Since the erasing/writing voltage $V_{pp}$ has not been supplied from the flash memory 14 since step ST98, contents in the flash memory 14 may be protected against false erasing or writing. Consequently, although the subroutine program is read directly from the flash memory 14 without using the RAM 15, the subroutine program will not run away.

After execution of the subroutine program, the CPU 12 sends at step ST100 the host microcomputer 10 a response signal indicating the completion of the procedure based on the command, and the main program routine ends.

On the other hand, if the program counter 13 does not indicate an address on the RAM 15 in advance of erasing and/or writing, the determination at step ST95 is negative. In this case, the main program routine proceeds to step ST101 where the CPU 12 writes numeral zero into bits 0 and 1 of the control register 19. Thus, bits 0 and 1 of the control register 19 are initialized. Directly after writing numeral zero into bits 0 and 1, the AND gate circuit 20 stops supplying the high voltage request signal to the switch 21, thereby disabling contents of the flash memory 14 to be erased or written.

The CPU 12 then executes an abnormality notification procedure at step ST102. In the abnormality notification procedure, the CPU 12 generates a notification for notifying the host microcomputer 10 of the occurrence of abnormality. The CPU 12 returns a response signal to the host microcomputer 10 at step ST100, and the main program routine ends. This response signal includes a notification of the occurrence of abnormality, whereby the host microcomputer 10 recognizes the occurrence of abnormality.

When the determination at step ST95 is negative, the contents of the flash memory 14 are never erased or written. Consequently, since contents of the flash memory 14 may be protected against renewal based on the subroutine program read directly from the flash memory 14, the subroutine program will not run away. Since the host microcomputer 10 receives the notification of the occurrence of abnormality generated at step ST102, a human operator of this system will appreciate the potentiality that the erasing/writing program to be loaded into the RAM 15 includes an error and so on, and thus may take a suitable action.

If the determination at step ST92 is negative since no request for erasing or writing occurs with respect to the flash memory 14, the main program routine proceeds from step ST92 to step ST103. At step ST103, the CPU 12 continues the subroutine program procedure based on the command from the host microcomputer 10 while reading the subroutine program from the flash memory 14. After completion of the execution of the subroutine program, the CPU 12 sends a response signal to the host microcomputer 10 at step ST100, and then the main program routine ends.

As described above, by virtue of the ninth embodiment, it is possible to remarkably reduce false entries into erasing or writing mode since the AND gate circuit 20 and the switch 21 enable the erasing/writing voltage $V_{pp}$ to be supplied to the flash memory 14 only when the erasing/writing program is ready to be read from the RAM 15 and when the EW request signal exists. Especially, the CPU 12 confirms whether the program is ready to be read from the RAM 15 or not, and the CPU 12 itself generates the EW permission signal when the confirmation result is affirmative. Therefore, false erasing or writing of contents of the flash memory 14 may be prevented during the program is read from the flash memory 14, and the program currently read from the flash memory 14 may be restrained from running away.

Tenth Embodiment.

Next, a tenth embodiment of the present invention will be described. In this embodiment, a time limit is established during steps for providing the flash memory with the erasing/writing voltage $V_{pp}$. That is to say, although a first condition for providing the flash memory 14 with the erasing/writing voltage $V_{pp}$ is satisfied, the erasing/writing program is not executed if a second condition is not satisfied within a certain time range after satisfaction of the first condition.

Figure 20:
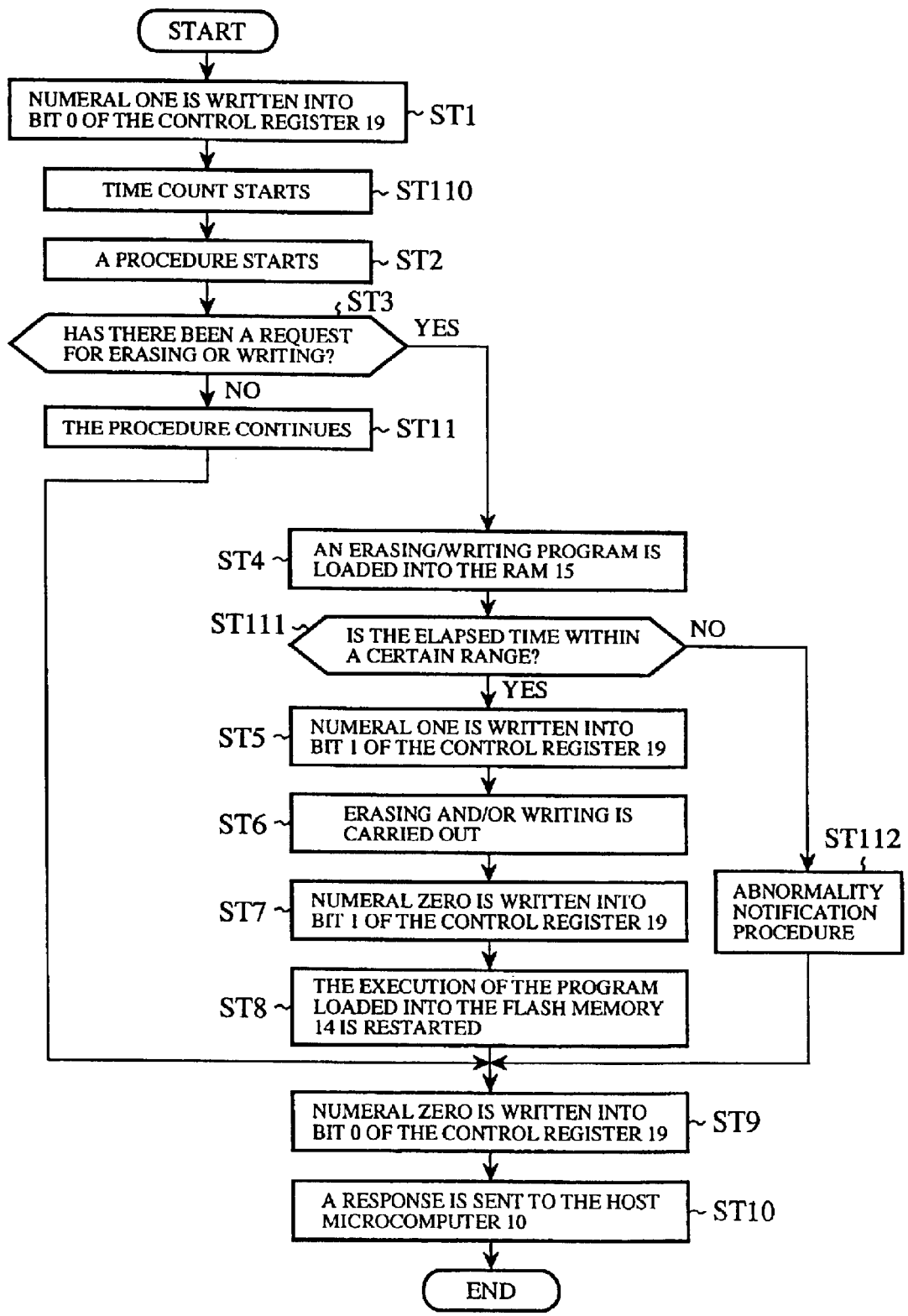
FIG. 20 is a flowchart illustrating a main program routine of a slave microcomputer according to a tenth embodiment of the present invention.

FIG. 20 is a flowchart that is a modification of FIG. 4, which relates to the first embodiment, according to the above-described concept. In this main program, after writing numeral one into bit 0 of the control register 19 at step ST1, time count starts at step ST110. Elapsed time may be measured by a built-in timer (not shown) of the CPU 12. After loading the erasing/writing program into the RAM 15 at step ST4, the CPU 12 decides whether the elapsed time is within the certain time range or not at step ST111. This time range or time limit is selected to be equal to a maximum span of time required for loading the erasing/writing program if the operation of the slave microcomputer 11 is normal. If it is decided at step ST111 that the elapsed time is within the certain time range, the CPU 12 writes numeral one into bit 1 of the control register 19 for supplying the EW request signal to the AND gate circuit 20 continually, and erases contents from and/or writes contents into the flash memory 14 (steps ST5 and ST6).

On the other hand, if it is determined at step ST111 that the elapsed time is not within the certain time range, the main program routine proceeds to step ST112 where the CPU 12 executes an abnormality notification procedure. In the abnormality notification procedure, the CPU 12 generates a notification for informing the host microcomputer 10 of the occurrence of abnormality. This notification is indicated in the response signal that the CPU 12 sends to the host microcomputer 10 at step ST10.

In accordance with the above concept, the fourth embodiment (see FIG. 8) may be modified. The main program routine of this modification will also resemble that illustrated in FIG. 20. However, since the EW permission signal from the host microcomputer 10 is used in this modification instead of the executing status signal (bit 0 of the control register 19), steps ST1 and ST9 in FIG. 20 are unnecessary. In this modification, the EW permission signal from the host microcomputer 10 is preferably supplied to not only the AND gate circuit 20 (see FIG. 8), but also to the CPU 12, so that the CPU 12 may start counting the elapsed time (step ST110) upon receiving the EW permission signal from the host microcomputer 10.

Figure 21:
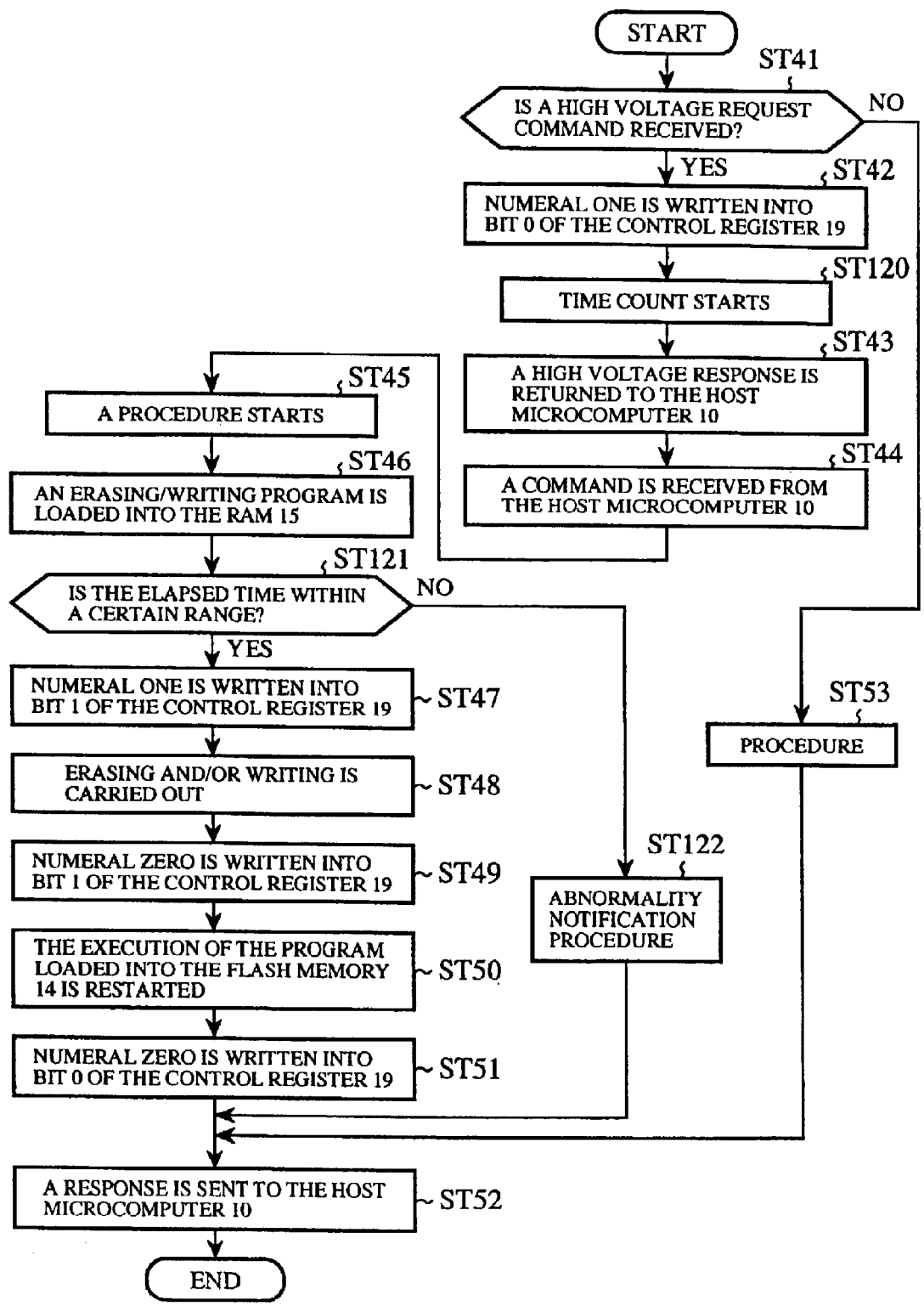
FIG. 21 is a flowchart illustrating a main program routine of a slave microcomputer according to a modification of the tenth embodiment.
Figure 22:
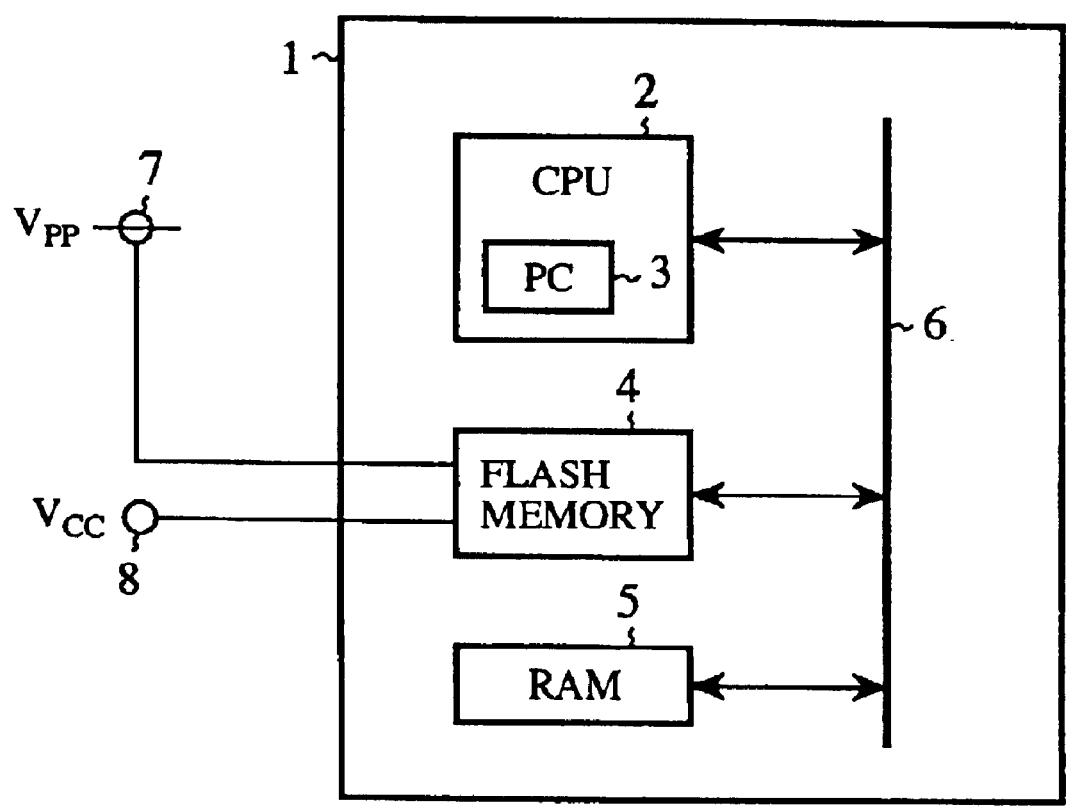
FIG. 22 is a block diagram showing an example of conventional microcomputers containing flash memories.

FIG. 21 is a flowchart that is a modification of FIG. 12, which relates to the fifth embodiment, modified according to the above-described concept. In this main program, once numeral one is written into bit 0 of the control register 19 at step ST42 for generating the executing status signal, the time count starts at step ST120. After loading the erasing/writing program into the RAM 15 at step ST46, the CPU 12 determines whether or not the elapsed time is within the certain time span at step ST121. If it is within the time span, the CPU 12 writes numeral one into bit 1 of the control register 19 for supplying the EW request signal to the AND gate circuit 20 continually, and then erases contents from and/or writes contents into the flash memory 14 (steps ST47 and ST48).

On the other hand, if it is determined at step ST121 that the elapsed time is not within the time range, the main program routine proceeds to step ST122 where the CPU 12 executes an abnormality notification procedure. In the abnormality notification procedure, the CPU 12 generates a notification for notifying the host microcomputer 10 of the occurrence of abnormality. This notification is indicated in the response signal that the CPU 12 sends to the host microcomputer 10 at step ST52.

As described above, by virtue of the tenth embodiment, although a condition for providing the flash memory 14 with the erasing/writing voltage $V_{pp}$ is satisfied, the erasing/writing program is not executed if a second condition is not satisfied within a certain time range after satisfaction of the first condition. When the slave microcomputer 11 malfunctions, the time span between the satisfactions of the first and second conditions varies from a standard or the second condition is not satisfied. In accordance with this embodiment, the establishment of the time limit permits a confirmation of normal execution of the sequence of the program, whereby it is possible to remarkably reduce false entries into erasing or writing mode with higher reliability.

While and present invention has been particularly shown and described with references to preferred embodiments thereof, it will be understood by those skilled in and art that various changes in form and details may be made therein without departing from and spirit and scope of and invention as defined by and claims. Such variations, alterations, and modifications are intended to be as equivalents encompassed in and scope of and claims.

For example, while the control register 19 within the CPU 12 is used for setting flags in the above-described embodiments, another control register located at a versatile output port outside the CPU may be used for setting flags. This versatile output port may be located either within the single chip comprising the slave microcomputer 11 or outside the shingle chip as a peripheral.

In addition, the idea described in conjunction with the second embodiment (FIG. 5) may be applied to other embodiments. That is to say, instead of the AND gate circuit, a CPU operating in accordance with software may directly supply the high voltage request signal to the switch 21 in other embodiments.

While the above-described embodiments relate to control for supplying the erasing/writing voltage to the flash memory, the above-described embodiments may be applied to be accommodated to supply a similar voltage to another EEPROM.

While each of the AND gate circuits 20, 20A, 20B, and 20C is built in the single-chip slave microcomputer 11 in the above-described embodiments, such an AND gate circuit may be located along with the switch 21 outside the chip of the slave microcomputer 11. Furthermore, the AND gate circuit may be located along with the switch 21 within the host microcomputer 10.

What is claimed is:

1. A microcomputer comprising:
   a nonvolatile memory for storing contents that can be erased from and written to the nonvolatile memory electrically when an erasing/writing voltage is supplied to the nonvolatile memory;
   a processor for executing a program stored in the nonvolatile memory;
   a setting element for setting a plurality of conditions for erasing contents from or writing contents into the nonvolatile memory; and
   an erasing/writing voltage supply enabler for enabling the erasing/writing voltage to be supplied to the nonvolatile memory when all of the plurality of conditions are satisfied, wherein the erasing/writing voltage supply enabler includes a switch interposed between an erasing/writing voltage supply and the nonvolatile memory for selectively supplying the erasing/writing voltage to the nonvolatile memory, the erasing/writing voltage supply being located outside a chip where the nonvolatile memory is located, the switch being located within the chip.

2. The microcomputer as recited in claim 1, comprising a host microcomputer and a slave microcomputer operating on the basis of a command from the host microcomputer; wherein the setting element includes first and second setting elements for respectively selling first and second conditions for erasing contents from or writing contents into the nonvolatile memory; wherein the slave microcomputer includes the nonvolatile memory, the processor, and the first setting element; and wherein the host microcomputer includes the second selling element.

3. The microcomputer as recited in claim 1, comprising a host microcomputer and a slave microcomputer operating on the basis of a command from the host microcomputer; wherein the slave microcomputer includes the nonvolatile memory, the processor, and the setting element; wherein the host microcomputer sends an erasing/writing voltage request signal to the slave microcomputer before sending the slave microcomputer a command that requires erasing contents from or writing contents into the nonvolatile memory; and wherein the setting element sets one of the conditions when the slave microcomputer receives the erasing/writing voltage request signal.

4. The microcomputer as recited in claim 1, wherein the setting element includes first and second setting elements for respectively setting first and second conditions for erasing contents from or writing contents into the nonvolatile memory, the first setting element including the processor, the second setting element being a circuit other than the processor and located within a chip where the processor is located, the second setting element confirming operational normality of the processor and setting the second condition when the operational normality is confirmed.

5. The microcomputer as recited in claim 1, further comprising a voltage measurer for measuring erasing/writing voltage given to the nonvolatile memory, the setting element resetting one of the conditions when the voltage is abnormal.

6. The microcomputer as recited in claim 1, comprising a host microcomputer and a slave microcomputer operating on the basis of a command from the host microcomputer; wherein the setting element includes first, second and third setting elements for respectively setting first, second, and third conditions for erasing contents from or writing contents into the nonvolatile memory; wherein the slave microcomputer includes the nonvolatile memory, the processor, and the first setting element; wherein the host microcomputer includes the second setting element; wherein the slave microcomputer further includes the third setting element and a voltage measurer for measuring erasing/writing voltage given to the nonvolatile memory, the third setting element resetting one of the conditions when the voltage is abnormal; and wherein the erasing/writing voltage supply enabler enables the erasing/writing voltage to be supplied to the nonvolatile memory when all of the first, second, and the third conditions are satisfied.

7. The microcomputer as recited in claim 1, further comprising a temporary memory capable of storing information temporally, wherein the processor stores a program for erasing contents from or writing contents into the nonvolatile memory prior to erasing contents from or writing contents into the nonvolatile memory, and wherein the processor determines whether or not an address of a next instruction to be executed is an address on the temporary memory and resets one of the conditions when the determination is negative.

8. A microcomputer comprising:
   a nonvolatile memory whose various data and programs stored therein are electrically erasable or writable from or into the nonvolatile memory when erasing/writing voltage is supplied to the nonvolatile memory;
   a processor for executing a program stored in the nonvolatile memory;
   a setting section, placed inside the processor, for setting a plurality of conditions for erasing or writing the various data and programs from or into the nonvolatile memory;
   an erasing/writing voltage supply enabler for generating an erasing/writing voltage request signal based on the plurality of conditions and outputting it when the plurality of conditions are satisfied; and
   selecting means, one end of which is connected to an erasing/writing voltage terminal and the other end of which is connected to the nonvolatile memory.

9. The microcomputer according to claim 8, wherein the selecting means includes a switch interposed between an erasing/writing voltage supplying section and the nonvolatile memory for selectively supplying the erasing/writing voltage to the nonvolatile memory in response to the erasing/writing voltage request signal, the erasing/writing voltage supplying section placed outside a chip where the nonvolatile memory is placed, the switch being placed within the chip.

10. The microcomputer according to claim 8, comprising a host microcomputer and a slave microcomputer operating in response to a command from the host microcomputer; wherein the setting section includes a first and a second setting sections for respectively setting a first and a second conditions for erasing or writing contents from or into the nonvolatile memory; wherein the slave microcomputer includes the nonvolatile memory, the processor, and the first setting section; and wherein the host microcomputer includes the second setting section.

11. The microcomputer according claim 8, comprising a host microcomputer and a slave microcomputer operating in response to a command from the host microcomputer; wherein the slave microcomputer includes the nonvolatile memory, the processor, and the setting section; wherein the host microcomputer sends the erasing/writing voltage request signal to the slave microcomputer before sending the slave microcomputer a command that requires erasing or writing contents from or into the nonvolatile memory; and wherein the setting section sets one of the conditions when the slave microcomputer receives the erasing/writing voltage request signal.

12. The microcomputer according to claim 8, wherein the setting section includes a first and a second setting sections for respectively setting first and second conditions for erasing or writing contents from or into the nonvolatile memory, the first setting section including the processor, the second setting section being a circuit other than the processor and placed within a chip where the processor is placed, the second setting section confirming whether or not the processor is operating normally and setting the second condition when it is operating normally.

13. The microcomputer according to claim 8, further comprising a voltage measurer for measuring erasing/writing voltage applied to the nonvolatile memory, the setting section resetting one of the conditions when the voltage is abnormal.

14. The microcomputer according to claim 8, comprising a host microcomputer and a slave microcomputer operating in response to a command from the host microcomputer; wherein the setting section includes first, second and third sections for respectively setting first, second and third conditions for erasing or writing contents from or into the nonvolatile memory; wherein the slave microcomputer includes the nonvolatile memory, the processor, and the first setting section; wherein the host microcomputer includes the second setting section; wherein the slave microcomputer further includes the second setting section; wherein the slave microcomputer further include the third setting section and a voltage measurer for measuring erasing/writing voltage applied to the nonvolatile memory; the third setting section resetting one of the conditions when the voltage is abnormal; and wherein the erasing/writing voltage supply enabler enables the erasing/writing voltage to be supplied to the nonvolatile memory when all of the first, the second, and the third conditions are satisfied.

15. The microcomputer according to claim 8, further comprising a temporary memory capable of storing information temporally, wherein the processor stores a program for erasing or writing contents from or into the nonvolatile memory prior to erasing or writing contents from or into the nonvolatile memory; and wherein the processor determines whether or not an address of a next instruction to be executed is an address on the temporary memory and resets one of the conditions when the address is not on the temporary memory.

16. The microcomputer according to claim 8, wherein the erasing/writing voltage supply enabler is an AND gate having two input terminals, to which the plurality of conditions, output by the processor, including a first condition as an erasing/writing request signal to erase or write the various data and programs from or into the nonvolatile memory and a second condition as a status signal indicating that the processor is executing a program, are supplied.

17. The microcomputer according to claim 16, wherein the plurality of conditions include a third condition as an erasing/writing permission signal output by the processor or a host computer in place of the second condition.

18. The microcomputer according to claim 17, wherein the third condition is output by a permission signal generating part for generating an erasing/writing permission signal and supplying it to the erasing/writing voltage supply enabler.

19. The microcomputer according to claim 16, wherein the plurality of conditions include a fourth condition as a normal voltage signal output by the processor in place of the second condition.

20. The microcomputer according to claim 8, wherein the erasing/writing voltage supply enabler is placed inside the microcomputer.

21. The microcomputer according to claim 8, wherein the erasing/writing voltage supply enabler is an AND gate having three input terminals, to which the plurality of conditions, output by the processor and a host computer, including a first condition as an erasing/writing request signal to erase or write the various data and programs from or into the nonvolatile memory and a third condition as an erasing/writing permission signal, are supplied.

22. The microcomputer according to claim 21, wherein one of the three input terminals is grounded.

23. The microcomputer according to claim 21, wherein one of the three input terminals is connected to a reading voltage terminal of the nonvolatile memory.

24. The microcomputer according to claim 8, wherein the erasing/writing voltage supply enabler is an AND gate having four input terminals, to which the plurality of conditions, output by the processor and a host computer, including a first condition as an erasing/writing request signal to erase or write the various data and programs from or into the nonvolatile memory, a second condition as a status signal indicating that the processor is executing a program, a third condition as an erasing/writing permission signal output by a host computer, and a fourth condition as a normal voltage signal, are supplied.

* * * * *